US005638294A

United States Patent [19]
Sasada

[11] Patent Number: 5,638,294
[45] Date of Patent: Jun. 10, 1997

[54] DEVICE AND METHOD FOR CALCULATING DELAY TIME

[75] Inventor: Makiko Sasada, Hyogo, Japan

[73] Assignee: Mitsubishi Denki Kabushiki Kaisha, Tokyo, Japan

[21] Appl. No.: 350,031

[22] Filed: Nov. 29, 1994

[30] Foreign Application Priority Data

Dec. 21, 1993 [JP] Japan .................. 5-322589

[51] Int. Cl.$^6$ .................. G06F 17/50; H01L 25/00
[52] U.S. Cl. .................. 364/491; 364/489; 364/578
[58] Field of Search .................. 364/489, 491, 364/468, 488, 300; 395/800

[56] References Cited

U.S. PATENT DOCUMENTS

| | | | |
|---|---|---|---|
| 4,263,651 | 4/1981 | Donath et al. | 364/300 |
| 5,051,911 | 9/1991 | Kimura et al. | 364/468 |
| 5,065,355 | 11/1991 | Hagase | 395/800 |
| 5,202,841 | 4/1993 | Tani | 364/491 |
| 5,359,534 | 10/1994 | Fujiki et al. | 364/489 |
| 5,381,345 | 1/1995 | Takegami et al. | 364/491 |
| 5,461,572 | 10/1995 | Ichikawa | 364/488 |
| 5,515,291 | 5/1996 | Omori et al. | 364/488 |

*Primary Examiner*—Kevin J. Teska
*Assistant Examiner*—Herbert McNair
*Attorney, Agent, or Firm*—Oblon, Spivak, McClelland, Maier & Neustadt, P.C.

[57] ABSTRACT

A line length extracting means (2) establishes a correspondence between line length data extracted from layout data (D2) and output lines in an LSI circuit specified by LSI circuit connection data (D1), respectively, to output line length data (D5) to a model selecting means (3), which in turn compares the total line length of each output line (output signal) with a predetermined reference line length (SL) on the basis of the line length data (D5) and selects an RC model for the output line having the total line length greater than the reference line length (SL) and a C model for the output line having the total line length less than the reference line length (SL) to output a model selection result (D6) in which selected model names correspond to output signal names to a wiring delay element inserting means (4), whereby a device and method for calculating an accurate delay time at high speeds is provided.

14 Claims, 22 Drawing Sheets

FIG. 6

```
N12   0.563pF   0.987ohm
N13   1.297pF   1.674ohm
 .       .         .
 .       .         .
N25   0.882pF   1.114ohm
N26   2.002pF   3.067ohm
 .       .         .
N29   3.162pF   2.584ohm
 .       .         .
 .       .         .
N58   0.652pF   0.254ohm
 .       .         .
N60   2.052pF   1.428ohm
 .       .         .
 .       .         .
N66   0.052pF   0.674ohm
 .       .         .
```
— D10

ON-LAYOUT SUB-LINE NAME | WIRING CAPACITANCE | WIRING RESISTANCE

```
SIG C11-O
CAP 1.16pF
     REQ 35.86Ω          D4
C14-I RC 167.85
C13-I RC 81.25
C12-I RC 130.77
```

FIG. 10

| ON-LAYOUT SUB-LINE NAME | LINE LENGTH | WIRING LAYER |
|---|---|---|
| N12 | 0.005mm | AL2 |
| N13 | 0.025mm | AL2 |
| . | . | . |
| . | . | . |
| N25 | 0.035mm | AL1 |
| N26 | 0.178mm | AL1 |
| . | . | . |
| N29 | 0.257mm | AL2 |
| . | . | . |
| N58 | 0.396mm | AL2 |
| . | . | . |
| N60 | 0.496mm | AL1 |
| . | . | . |
| . | . | . |
| N66 | 0.088mm | AL2 |
| . | . | . |
| . | . | . |

```
                                              D5
OUTPUT SIGNAL
 NAME      AL1(mm)     AL2(mm)     AL3(mm)    total(mm)

Sig1      10.286      0.267       2.045      12.598

Sig2       5.297      2.078       3.002      10.377

Sig3       6.077     11.978       0.687      18.742

```
cell (NOTE)
INPUT A
OUTPUT Y
rise RF K1=0.143 K2=1.298 K3=0.987 K4=0.076
fall RR K1=0.412 K2=1.097 K3=0.878 K4=0.065
drive DR=1.087 DF=0.896
comax 10.05
funout 20
pinCap A=0.045 Y=0.066
    ⋮
```

$$Td(rise) = f(Cin*, Cout, K1(r), K2(r), K3(r), K4(r)) \cdots (1)$$
$$Td(fall) = f(Cin*, Cout, K1(f), K2(f), K3(f), K4(f)) \cdots (2)$$

DEVICE AND METHOD FOR CALCULATING DELAY TIME

BACKGROUND OF THE INVENTION

1. Field of the Invention

The present invention relates to a delay time calculating device required for semiconductor logic verification, particularly for logic verification in back annotation of actual wiring information from layout data.

2. Description of the Background Art

FIG. 26 is a block diagram showing respective means forming a conventional delay time calculating device for back annotation of actual wiring information (parasitic wiring resistance and capacitance) from circuit connection data and layout data to calculate a delay time, and input/output information thereof.

As shown in FIG. 26, LSI circuit connection data D1 for specifying an LSI circuit to be verified by describing cells having predetermined logic functions and connection therebetween is applied to a C/RC model extracting means 1, a wiring delay element inserting means 4, a C model delay calculating means 7, and a C model associated detailed delay logic simulation 61 by an LSI circuit connection data providing means not shown.

Layout data D2 specifying a layout pattern of the LSI circuit corresponding to the LSI circuit connection data D1 is applied to the C/RC model extracting mean 1 by layout data providing means not shown.

The C/RC model extracting means 1 extracts lines for interconnecting cells and parasitic wiring resistances and capacitances serving as loads upon the lines from the LSI circuit connection data D1 and the layout data D2. The C/RC model extracting means 1 then outputs to the C model delay calculating means 7 a C model output result D3 having a predetermined file format in which only the parasitic wiring capacitances among the extracted wiring resistances and capacitances correspond respectively to a plurality of output lines carrying output signals from a plurality of cells in the LSI circuit specified by the LSI circuit connection data D1, and outputs to an RC model delay calculating means 8 an RC model output result D4 having a predetermined file format in which the parasitic wiring resistances and capacitances correspond respectively to the plurality of output lines.

The wiring delay element inserting means 4 inserts wiring delay elements into all signalling lines lying in the LSI circuit specified by the LSI circuit connection data D1 to output wiring delay element inserted LSI circuit connection data D7 to the RC model delay calculating means 8.

A cell-by-cell delay parameter library D8 having data groups specifying the delay time cell by cell is applied to the C model delay calculating means 7 and the RC model delay calculating means 8 by a cell-by-cell delay parameter library providing means not shown.

The C model delay calculating means 7 calculates a delay value for each cell by using an existing capacitance dependent delay calculating formula on the basis of the LSI circuit connection data D1, the C model output result D3, and the cell-by-cell parameter library D8, and then outputs C model associated delay value data D14 to the C model associated detailed delay logic simulation 61.

The RC model delay calculating means 8 calculates a delay value for each cell having a function and each wiring delay element by using an existing resistance and capacitance data dependent delay calculating formula on the basis of the RC model output result D4, the wiring delay element inserted LSI circuit connection data D7, and the cell-by-cell delay parameter library D8, and then outputs RC model associated delay value data D15 to an RC model associated detailed delay logic simulation 62.

The C model associated detailed delay logic simulation 61 executes detailed delay logic simulation associated with a C model on the basis of the LSI circuit connection data D1 and the C model associated delay value data D14.

The RC model associated detailed delay logic simulation 62 executes detailed delay logic simulation associated with an RC model on the basis of the wiring delay element inserted LSI circuit connection data D7 and the RC model associated delay value data D15.

FIG. 27 is a flow chart showing a delay calculating method associated with the C model. Referring to FIG. 27, the C/RC model extracting means 1 extracts the lines for interconnecting the cells and the parasitic wiring capacitances serving as loads upon the lines from the LSI circuit connection data D1, and outputs the C model output result D3 to the C model delay calculating means 7 in the step S31.

In the step S32, the C model delay calculating means 7 calculates the delay value for each cell by using the existing capacitance dependent delay calculating formula on the basis of the LSI circuit connection data D1, the C model output result D3, and the cell-by-cell delay parameter library D8, and then outputs the C model associated delay value data D14 to the C model associated detailed delay logic simulation 61.

FIG. 28 is a flow chart showing a delay calculating method associated with the RC model. Referring to FIG. 28, the C/RC model extracting means 1 extracts the lines for interconnecting the cells and the parasitic wiring resistances and capacitances serving as loads upon the lines from the LSI circuit connection data D1, and outputs the RC model output result D4 to the RC model delay calculating means 8 in the step S41.

In the step S42, the wiring delay element inserting means 4 inserts the wiring delay elements into all signalling lines lying in the LSI circuit specified by the LSI circuit connection data D1, and outputs the wiring delay element inserted LSI circuit connection data D7 to the RC model delay calculating means 8.

In the step S43, the RC model delay calculating means 8 calculates the delay value for each cell having a function and each wiring delay element by using the existing resistance and capacitance data dependent delay calculating formula on the basis of the RC model output result D4, the wiring delay element inserted LSI circuit connection data D7, and the cell-by-cell delay parameter library D8, and outputs the RC model associated delay value data D15 to the RC model associated detailed delay logic simulation 62.

In the conventional delay time calculating device as above constructed, the delay calculating flow is divided into the flow in which all signals are associated with the C model as shown in FIG. 27 and the flow in which all signals are associated with the RC model as shown in FIG. 28.

The former flow associated with the C model, in which the wiring delay elements are not added, permits high-speed delay time calculation and detailed delay logic simulation, but is disadvantageous in that, in terms of size reduction in future, consideration is not given to resistance elements, resulting in increased delay accuracy errors.

The latter flow associated with the RC model has no problem with respect to the delay accuracy since the accuracy is increased. However, it takes time to calculate the delay time because of insertion of the wiring delay elements into all signals, resulting in impractical simulation speeds.

SUMMARY OF THE INVENTION

According to the present invention, a device for calculating a delay time comprises: circuit connection data providing means for providing circuit connection data specifying a circuit to be verified by describing a plurality of cells each having a predetermined logic function and connection therebetween; layout data providing means for providing layout data specifying a layout pattern of the circuit to be verified; model data extracting means for extracting cell-to-cell interconnecting lines in the circuit to be verified and parasitic capacitances and parasitic resistances on the lines on the basis of the circuit connection data and the layout data, to output capacitance model data in which the parasitic capacitances correspond respectively to a plurality of output lines carrying output signals from the plurality of cells in the circuit to be verified, and resistance and capacitance model data in which the parasitic capacitances and the parasitic resistances correspond respectively to the plurality of output lines; model indication data providing means for providing model indication data indicative of one of a capacitance model and a resistance and capacitance model for each of the plurality of cells and the output lines thereof in the circuit to be verified; and delay time calculating means for calculating the delay time for the cells and output lines for which the model indication data indicates the capacitance model by using the capacitance model data and a predetermined capacitance dependent delay calculating process, and calculating the delay time for the cells and output lines for which the model indication data indicates the resistance and capacitance model by using the resistance and capacitance model data and a predetermined resistance and capacitance dependent delay calculating process, on the basis of the capacitance model data, the resistance and capacitance model data, and the model indication data.

The delay time calculating means of the delay time calculating device of the present invention performs delay time calculation upon the cells and output lines for which the mode indication data indicates the capacitance model by using the capacitance model data and the predetermined capacitance dependent delay calculating process, and performs delay time calculation upon the cells and output lines for which the model indication data indicates the resistance and capacitance model by using the resistance and capacitance model data and the predetermined resistance and capacitance dependent delay calculating process, on the basis of the capacitance model data, the resistance and capacitance model data, and the model indication data. This allows the model indication data to selectively indicate the resistance and capacitance model for the cells and the output lines, to execute the delay time calculation by means of the resistance and capacitance dependent delay calculating process.

The resistance and capacitance model is indicated only for the cells and output lines required to take the wiring resistances into consideration for delay calculation, and the model indication data indicative of the capacitance model for other cells and output lines is applied to the delay time calculating means, providing high-speed calculation of the accurate delay time.

In another aspect of the present invention, the device for calculating a delay time comprises: circuit connection data providing means for providing circuit connection data specifying a circuit to be verified by describing a plurality of cells each having a predetermined logic function and connection therebetween; layout data providing means for providing layout data specifying a layout pattern of the circuit to be verified; model data extracting means for extracting cell-to-cell interconnecting lines in the circuit to be verified and parasitic capacitances and parasitic resistances on the lines on the basis of the circuit connection data and the layout data, to output capacitance model data in which the parasitic capacitances correspond respectively to a plurality of output lines carrying output signals from the plurality of cells in the circuit to be verified, and resistance and capacitance model data in which the parasitic capacitances and the parasitic resistances correspond respectively to the plurality of output lines; signal-by-signal line length data extracting means for extracting the line length of each of the plurality of output lines in the circuit to be verified on the basis of the circuit connection data and the layout data, to output line length data; model selecting means receiving the circuit connection data and the line length data for outputting a model selection result for each of the plurality of output lines in the circuit to be verified on the basis of a comparison result between the line length of each of the plurality of output lines and a predetermined reference line length, the model selection result being indicative of a resistance and capacitance model when the line length is greater than the reference line length and being indicative of a capacitance model when the line length is not greater than the reference line length; wiring delay element inserting means for inserting a wiring delay element into the output lines for which the model selection result indicates the resistance and capacitance model among the plurality of output lines in the circuit to be verified on the basis of the circuit connection data and the model election result, to output wiring delay element inserted circuit connection data; and delay time calculating means for calculating the delay time for the output lines in which the wiring delay element is inserted and cells having the output lines by using the resistance and capacitance model data and a predetermined resistance and capacitance dependent delay calculating formula, and calculating the delay time for output lines in which the wiring delay element is not inserted and cells having the output lines by using the capacitance model data and a predetermined capacitance dependent delay calculating formula, on the basis of the capacitance model data, the resistance and capacitance model data, and the wiring delay element inserted circuit connection data.

The model selecting means of the delay time calculating device of the second aspect of the present invention outputs the model selection result for the plurality of output lines in the circuit to be verified on the basis of the comparison result between the line length of the plurality of output lines and the predetermined reference line length, the model selection result being indicative of the resistance and capacitance model when the line length is greater than the reference line length and being indicative of the capacitance model in other cases. The resistance and capacitance model is indicated only when the line length closely related to the wiring resistance is greater than the reference line length and it is judged that the resistance is not negligible.

The delay time calculating means automatically performs the delay time calculation for the resistance and capacitance model only upon the output lines required to take the wiring resistances into consideration for delay calculation and the cells having the output lines, and performs the delay time calculation for the capacitance model upon other cells and the output lines thereof. This provides high-speed calculation of the accurate delay time.

Preferably, the line length extracting means includes: subline-by-subline line length extracting means for extracting the line length of each sub-line into which each of the lines is divided at a branch point on the basis of the layout data, to output subline-by-subline line length data; output line associated data extracting means for extracting at least one of the sub-lines corresponding to the plurity of output lines carrying the plurality of output signals in the circuit to be verified on the basis of the circuit connection data and the layout data, to provide output line associated data; and line length computing means for computing the line length of each of the plurality of output lines on the basis of the output line associated data and the subline-by-subline line length data, to output the line length data.

The line length extracting means of the delay time calculating device of the present invention includes the line length computing means for computing the line length of each of the plurality of output lines on the basis of the output line associated data and subline-by-subline line length data to output the line length data. The line length of the sub-lines into which the respective lines are divided at the branch points is described in the subline-by-subline line length data. On the basis of the subline-by-subline line length data, the line length data of the respective output lines are computed more accurately, and the accuracy of the selection reference of the model selecting means is improved which is based on the line length data.

In a third aspect of the present invention, the device for calculating a delay time comprises: circuit connection data providing means for providing circuit connection data specifying a circuit to be verified by describing a plurality of cells each having a predetermined logic function and providing an output signal driven by a transistor and connection between the plurality of cells; layout data providing means for providing layout data specifying a layout pattern of the circuit to be verified; model data extracting means for extracting cell-to-cell interconnecting lines in the circuit to be verified and parasitic capacitances and parasitic resistances on the lines on the basis of the circuit connection data and the layout data, to output capacitance model data in which the parasitic capacitances correspond respectively to a plurality of output lines carrying the output signals from the plurality of cells in the circuit to be verified, and resistance and capacitance model data in which the parasitic capacitances and the parasitic resistances correspond respectively to the plurality of output lines; on-resistance associated data providing means for providing on-resistance associated data associated with an on-resistance of the cell driving transistor; model selecting means receiving the circuit connection data, the resistance and capacitance model data and the on-resistance associated data for computing an on-resistance of each of the plurality of cells in the circuit to be verified on the basis of the on-resistance associated data, to output a model selection result indicative of selection of one of a capacitance model and a resistance and capacitance model for each of the plurality of output lines in the circuit to be verified on the basis of relationship between the on-resistance of each of the plurality of cells and a wiring resistance of each of the output lines of the cells; wiring delay element inserting means for inserting a wiring delay element into the output lines for which the model selection result indicates the resistance and capacitance model among the plurality of output lines in the circuit to be verified on the basis of the circuit connection data and the model selection result, to output wiring delay element inserted circuit connection data; and delay time calculating means for calculating the delay time for the output lines in which the wiring delay element is inserted and cells having the output lines by using the resistance and capacitance model data and a predetermined resistance and capacitance dependent delay calculating formula, and calculating the delay time for output lines in which the wiring delay element is not inserted and cells having the output lines by using the capacitance model data and a predetermined capacitance dependent delay calculating formula, on the basis of the capacitance model data, the resistance and capacitance model data, and the wiring delay element inserted circuit connection data.

The model selecting means of the delay time calculating device of the third aspect of the present invention computes the on-resistance of each of the plurality of cells in the circuit to be verified on the basis of the on-resistance associated data, to output the model selection result indicative of selection of one of the capacitance model and the resistance and capacitance model for each of the plurality of output lines in the circuit to be verified on the basis of relationship between the on-resistances of the plurality of cells and the wiring resistance of the output lines of the cells. The resistance and capacitance model is indicated only when it is judged that the wiring resistance results in non-negligible delay from the relationship between the on-resistance of the cells and the wiring resistance of the cell output lines.

The delay time calculating means automatically performs the delay time calculation for the resistance and capacitance model upon the output lines required to take into consideration the wiring resistance to which the on-resistance is added for delay calculation and the cells having the output lines, and performs the delay time calculation for the capacitance model upon other cells and the output lines thereof, thereby permitting high-speed calculation of the accurate delay time.

Preferably, the on-resistance associated data providing means further provides delay parameter data specifying for each cell type a group of delay parameters to be applied to the predetermined capacitance dependent delay calculating formula and the predetermined resistance and capacitance dependent delay calculating formula, and the delay time calculating means calculates the delay time for the output lines in which the wiring delay element is inserted and the cells having the output lines by applying the group of delay parameters to the predetermined resistance and capacitance dependent delay calculating formula using the resistance and capacitance model data, and calculates the delay time for the output lines in which the wiring delay element is not inserted and the cells having the output lines by applying the group of delay parameters to the predetermined capacitance dependent delay calculating formula using the capacitance model data, on the basis of the capacitance model data, the resistance and capacitance model data, the wiring delay element inserted circuit connection data, and the delay parameter data.

The on-resistance associated data providing means of the delay time calculating device of the present invention provides the delay parameter data specifying for each cell type the group of delay parameters for the predetermined capacitance dependent delay calculating formula and the predetermined resistance and capacitance dependent delay calculating formula. The delay time calculating means calculates the delay time by applying the group of delay parameters to the predetermined resistance and capacitance dependent delay calculating formula when the resistance and capacitance model data is used, and calculates the delay time by applying the group of delay parameters to the capacitance dependent delay calculating formula when the capacitance model data is used, thereby improving the calculation accuracy.

In a fourth aspect of the present invention, the device for calculating a delay time, comprises: circuit connection data providing means for providing circuit connection data specifying a circuit to be verified by describing a plurality of cells each having a predetermined logic function and providing an output signal driven by a transistor and connection between the plurality of cells; layout data providing means for providing layout data specifying a layout pattern of the circuit to be verified; model data extracting means for extracting cell-to-cell interconnecting lines in the circuit to be verified and parasitic capacitances and parasitic resistances on the lines on the basis of the circuit connection data and the layout data, to output capacitance model data in which the parasitic capacitances correspond respectively to a plurality of output lines carrying the output signals from the plurality of cells in the circuit to be verified, and resistance and capacitance model data in which the parasitic capacitances and the parasitic resistances correspond respectively to the plurality of output lines; output signal data providing means for providing output signal data indicative of selection of one of a resistance and capacitance model and a capacitance model for each of the plurality of output signals in the circuit to be verified; model selecting means for outputting a model selection result indicative of the resistance and capacitance model for output lines corresponding to the output signals for which selection of the resistance and capacitance model is indicated among the plurality of output lines in the circuit to be verified on the basis of the circuit connection data and the output signal data; wiring delay element inserting means for inserting a wiring delay element into the output lines for which the model selection result indicates the resistance and capacitance model among the plurality of output lines in the circuit to be verified on the basis of the circuit connection data and the model selection result, to output wiring delay element inserted circuit connection data; and delay time calculating means for calculating the delay time for the output lines in which the wiring delay element is inserted and cells having the output lines by using the resistance and capacitance model data and a predetermined resistance and capacitance dependent delay calculating formula, and calculating the delay time for output lines in which the wiring delay element is not inserted and cells having the output lines by using the capacitance model data and a predetermined capacitance dependent delay calculating formula, on the basis of the capacitance model data, the resistance and capacitance model data, and the wiring delay element inserted circuit connection data.

The delay time calculating device of the fourth aspect of the present invention comprises the output signal data providing means for providing the output signal data indicative of selection of one of the resistance and capacitance model and the capacitance model for each of the plurality of output signals in the circuit to be verified, and the model selecting means for outputting the model selection result indicative of the resistance and capacitance model for the output lines corresponding to the output signals indicative of the resistance and capacitance model among the plurality of output lines in the circuit to be verified on the basis of the circuit connection data and the output signal data.

A designer or the like produces the output signal data indicative of selection of the resistance and capacitance model for the output signals required to take the wiring resistances into consideration for delay calculation, whereby the model selecting means indicates the resistance and capacitance model for a minimum number of output lines required.

Consequently, the delay time calculating means automatically performs the delay time calculation for the resistance and capacitance model upon the output lines required to taken the wiring resistances into consideration for delay calculation and the cells having the output lines, and performs the delay time calculation for the capacitance model upon other cells and the output lines thereof, thereby permitting high speed calculation of the accurate delay time.

In a fifth aspect of the present invention, the device for calculating a delay time comprises: circuit connection data providing means for providing circuit connection data specifying a circuit to be verified by describing a plurality of cells each having a predetermined logic function and providing an output signal driven by a transistor and connection between the plurality of cells; layout data providing means for providing layout data specifying a layout pattern of the circuit to be verified; model data extracting means for extracting cell-to-cell interconnecting lines in the circuit to be verified and parasitic capacitances and parasitic resistances on the lines on the basis of the circuit connection data and the layout data, to output capacitance model data in which the parasitic capacitances correspond respectively to a plurality of output lines carrying the output signals from the plurality of cells in the circuit to be verified, and resistance and capacitance model data in which the parasitic capacitances and the parasitic resistances correspond respectively to the plurality of output lines; signal path data providing means for providing signal path data indicative of a signal path provided on the circuit to be verified and selecting one of a resistance and capacitance model and a capacitance model; model selecting means for outputting a model selection result indicative of the resistance and capacitance model for all output lines lying on the signal path for which selection of the resistance and capacitance model is indicated among the plurality of output lines in the circuit to be verified on the basis of the circuit connection data and the signal path data; wiring delay element inserting means for inserting a wiring delay element into the output lines for which the model selection result indicates the resistance and capacitance model among the plurality of output lines in the circuit to be verified on the basis of the circuit connection data and the model selection result, to output wiring delay element inserted circuit connection data; and delay time calculating means for calculating the delay time for the output lines in which the wiring delay element is inserted and cells having the output lines by using the resistance and capacitance model data and a predetermined resistance and capacitance dependent delay calculating formula, and calculating the delay time for output lines in which the wiring delay element is not inserted and cells having the output lines by using the capacitance model data and a predetermined capacitance dependent delay calculating formula, on the basis of the capacitance model data, the resistance and capacitance model data, and the wiring delay element inserted circuit connection data.

The delay time calculating device of the fifth aspect of the present invention comprises the signal path data providing means for providing the signal path data indicative of the signal path on the circuit to be verified selecting one of the resistance and capacitance model and the capacitance model, and the model selecting means for outputting the model selection result indicative of the resistance and capacitance model for all output lines lying on the signal path indicative of the resistance and capacitance model among the plurality of output lines in the circuit to be verified on the basis of the circuit connection data and the signal path data.

A designer or the like produces the signal path data indicative of the resistance and capacitance model for the signal path required to take the wiring resistances into consideration for delay calculation, whereby the model selecting means indicates the resistance and capacitance model for a minimum number of output lines required on the signal path indicated by the signal path data.

Consequently, the delay time calculating means automatically performs the delay time calculation for the resistance and capacitance model upon the output lines required to take the wiring resistances into consideration for delay calculation and the cells having the output lines, and performs the delay time calculation for the capacitance model upon other cells and the output lines thereof, thereby permitting high speed calculation of the accurate delay time.

In addition, the models to be selected for all output lines on the signal path are determined only by indicating the signal path by the signal path data, thereby permitting designation of the models to be selected relatively easily.

Preferably, the delay time calculating device further comprises delay parameter data providing means for providing delay parameter data specifying for each cell type a group of delay parameters for used in the predetermined capacitance dependent delay calculating formula and the predetermined resistance and capacitance dependent delay calculating formula, and the delay time calculating means calculates the delay time for the output lines in which the wiring delay element is inserted and the cells having the output lines by applying the group of delay parameters to the predetermined resistance and capacitance dependent delay calculating formula using the resistance and capacitance model data, and calculates the delay time for the output lines in which the wiring delay element is not inserted and the cells having the output lines by applying the group of delay parameters to the predetermined capacitance dependent delay calculating formula using the capacitance mode data, on the basis of the capacitance model data, the resistance and capacitance model data, the wiring delay element inserted circuit connection data, and the delay parameter data.

The delay parameter data providing means of the delay time calculating device of the present invention provides the delay parameter data specifying for each cell type the group of delay parameters for use in the predetermined capacitance dependent delay calculating formula and the predetermined resistance and capacitance dependent delay calculating formula. The delay time calculating means calculates the delay time by applying the group of delay parameters to the predetermined resistance and capacitance dependent delay calculating formula when the resistance and capacitance model data is used, and calculates the delay time by applying the group of delay parameters to the predetermined capacitance dependent delay calculating formula when the capacitance model data is used. The delay calculation is executed at a more sophisticated level, and the delay calculation accuracy is improved.

The present invention is also intended for a method of calculating a delay time. According to the present invention, the method comprises the steps of: receiving circuit connection data specifying a circuit to be verified by describing a plurality of cells each having a predetermined logic function and connection therebetween, and layout data specifying a layout pattern of the circuit to be verified, and extracting cell-to-cell interconnecting lines in the circuit to be verified and parasitic capacitances and parasitic resistances on the lines on the basis of the circuit connection data and the layout data, to output capacitance model data in which the parasitic capacitances correspond respectively to a plurality of output lines carrying output signals from the plurality of cells in the circuit to be verified, and resistance and capacitance model data in which the parasitic capacitances and the parasitic resistances correspond respectively to the plurality of output lines; providing model indication data indicative of one of a capacitance model and a resistance and capacitance model for each of the plurality of cells in the circuit to be verified and the output lines thereof; and calculating the delay time for the cells and output lines for which the model indication data indicates the capacitance model by using the capacitance model data and a predetermined capacitance dependent delay calculating process, and calculating the delay time for the cells and output lines for which the model indication data indicates the resistance and capacitance model by using the resistance and capacitance model data and a predetermined resistance and capacitance dependent delay calculating process, on the basis of the capacitance model data, the resistance and capacitance model data, and the model indicating data.

In the method of the present invention, on the basis of the capacitance model data, the resistance and capacitance model data, and the model indication data, the delay time calculation is performed upon the cells for which the model indication data indicates the capacitance model and the output lines thereof by using the capacitance model data and the predetermined capacitance dependent delay calculating process, and is performed upon the cells for which the model indication data indicates the resistance and capacitance model and the output lines thereof by using the resistance and capacitance model data and the predetermined resistance and capacitance dependent delay calculating process. This allows the model indication data to selectively indicate the resistance and capacitance model for the cells and the output lines thereof, whereby the delay time is calculated by means of the resistance and capacitance dependent delay calculating process.

Accurate delay time is calculated at high speeds by providing the model indication data indicative of the resistance and capacitance model for the cells required to take the wiring resistances into consideration for delay calculation and the output lines thereof and indicative of the capacitance model for other cells and the output lines thereof.

In another aspect of the present invention, the method of calculating a delay time comprises the steps of: receiving circuit connection data specifying a circuit to be verified by describing a plurality of cells each having a predetermined logic function and connection therebetween, and layout data specifying a layout pattern of the circuit to be verified, and extracting cell-to-cell interconnecting lines in the circuit to be verified and parasitic capacitances and parasitic resistances on the lines on the basis of the circuit connection data and the layout data, to output capacitance model data in which the parasitic capacitances correspond respectively to a plurality of output lines carrying output signals from the plurality of cells in the circuit to be verified, and resistance and capacitance model data in which the parasitic capacitances and the parasitic resistances correspond respectively to the plurality of output lines; extracting the line length of each of the plurality of output lines in the circuit to be verified on the basis of the circuit connection data and the layout data, to output line length data; receiving the circuit connection data and the line length data, to output a model selection result for each of the plurality of output lines in the circuit to be verified on the basis of a comparison result between the line length of each of the plurality of output lines and a predetermined reference line length, the model selection result being indicative of a resistance and capacitance model when the line length is greater than the reference line length and being indicative of a capacitance model when the line length is not greater than the reference line length; inserting a wiring delay element into the output lines for which the model selection result indicates the resistance and capacitance model among the plurality of output lines in the circuit to be verified on the basis of the circuit connection data and the model selection result, to output wiring delay element inserted circuit connection data; and calculating the delay time for the output lines in which the wiring delay element is inserted and cells having the output lines by using the resistance and capacitance model data and a predetermined resistance and capacitance dependent delay calculating formula, and calculating the delay time for output lines in which the wiring delay element is not inserted and cells having the output lines by using the capacitance model data and a predetermined capacitance dependent delay calculating formula, on the basis of the capacitance model data, the resistance and capacitance model data, and the wiring delay element inserted circuit connection data.

In this method, the model selection result is outputted for each of the plurality of output lines in the circuit to be verified on the basis of the comparison result between the line length of the plurality of output lines and the predetermined reference line length, the model selection result being indicative of the resistance and capacitance model when the line length is greater than the reference line length and being indicative of the capacitance model in other cases. The resistance and capacitance model is indicated only when the line length closely related to the wiring resistance is greater than the reference line length so that it is judged that the resistance is not negligible.

The step of calculating the delay time automatically provides the delay time calculation for the resistance and capacitance model upon the output lines required to take the wiring resistances into consideration for delay calculation and the cells having the output lines, and provides the delay time calculation for the capacitance model upon other cells and the output lines thereof, thereby permitting high-speed calculation of the accurate delay time.

In still another aspect of the present invention, the method of calculating a delay time comprises the steps of: receiving circuit connection data specifying a circuit to be verified by describing a plurality of cells each having a predetermined logic function and providing an output signal driven by a transistor and connection between the plurality of cells, and layout data specifying a layout pattern of the circuit to be verified, and extracting cell-to-cell interconnecting lines in the circuit to be verified and parasitic capacitances and parasitic resistances on the lines on the basis of the circuit connection data and the layout data, to output capacitance model data in which the parasitic capacitances correspond respectively to a plurality of output lines carrying the output signals from the plurality of cells in the circuit to be verified, and resistance and capacitance model data in which the parasitic capacitances and the parasitic resistances correspond respectively to the plurality of output lines; receiving on-resistance associated data associated with an on-resistance of the cell driving transistor, the circuit connection data, and the resistance and capacitance model data, and computing an on-resistance of each of the plurality of cells in the circuit to be verified on the basis of the on-resistance associated data, to output a model selection result indicative of selection of one of a capacitance model and a resistance and capacitance model for each of the plurality of output lines in the circuit to be verified on the basis of relationship between the on-resistance of each of the plurality of cells and a wiring resistance of each of the output lines of the plurality of cells; inserting a wiring delay element into the output lines for which the model selection result indicates the resistance and capacitance model among the plurality of output lines in the circuit to be verified on the basis of the circuit connection data and the model selection result, to output wiring delay element inserted circuit connection data; and calculating the delay time for the output lines in which the wiring delay element is inserted and cells having the output lines by using the resistance and capacitance model data and a predetermined resistance and capacitance dependent delay calculating formula, and calculating the delay time for output lines in which the wiring delay element is not inserted and cells having the output lines by using the capacitance model data and a predetermined capacitance dependent delay calculating formula, on the basis of the capacitance model data, the resistance and capacitance model data, and the wiring delay element inserted circuit connection data.

In this method, the on-resistance of each of the plurality of cells in the circuit to be verified is computed on the basis of the on-resistance associated data, and the model selection result is outputted on the basis of the relationship between the on-resistance of each of the plurality of cells and the wiring resistance of the output lines of the cells, the model selection result being indicative of selection of one of the capacitance model and the resistance and capacitance model for each of the plurality of output lines in the circuit to be verified. The resistance and capacitance model is indicated only when the wiring resistance results in negligible delay from the relationship between the on-resistance of the cells and the wiring resistance of the cell output lines.

The step of calculating the delay time automatically provides the delay time calculation for the resistance and capacitance model upon the output lines required to take into consideration the on-resistance added wiring resistance for delay calculation and the cells having the output lines, and provides the delay time calculation for the capacitance model upon other cells and the output lines thereof, thereby permitting high-speed calculation of the accurate delay time.

In a further aspect of the present invention, the method of calculating a delay time comprises the steps of: receiving circuit connection data specifying a circuit to be verified by describing a plurality of cells each having a predetermined logic function and providing an output signal driven by a transistor and connection between the plurality of cells, and layout data specifying a layout pattern of the circuit to be verified, and extracting cell-to-cell interconnecting lines in the circuit to be verified and parasitic capacitances and parasitic resistances on the lines on the basis of the circuit connection data and the layout data, to output capacitance model data in which the parasitic capacitances correspond respectively to a plurality of output lines carrying the output signals from the plurality of cells in the circuit to be verified, and resistance and capacitance model data in which the parasitic capacitances and the parasitic resistances correspond respectively to the plurality of output lines; providing output signal data indicative of selection of one of a resistance and capacitance model and a capacitance model for each of the plurality of output signals in the circuit to be verified; outputting a model selection result indicative of the resistance and capacitance model for output lines corresponding to the output signals for which selection of the resistance and capacitance model is indicated among the plurality of output lines in the circuit to be verified on the basis of the circuit connection data and the output signal data; inserting a wiring delay element into the output lines for which the model selection result indicates the resistance and capacitance model among the plurality of output lines in the circuit to be verified on the basis of the circuit connection data and the model selection result, to output wiring delay element inserted circuit connection data; and calculating the delay time for the output lines in which the wiring delay element is inserted and cells having the output lines by using the resistance and capacitance model data and a predetermined resistance and capacitance dependent delay calculating formula, and calculating the delay time for output lines in which the wiring delay element is not inserted and cells having the output lines by using the capacitance model data and a predetermined capacitance dependent delay calculating formula, on the basis of the capacitance model data, the resistance and capacitance model data, and the wiring delay element inserted circuit connection data.

This method comprises the step of providing the output signal data indicative of selection of one of the resistance and capacitance model and the capacitance model for each of the plurality of output signals in the circuit to be verified, and the step of outputting the model selection result indicative of the resistance and capacitance model for the output lines corresponding to the output signals indicative of the resistance and capacitance model among the plurality of output lines in the circuit to be verified on the basis of the circuit connection data and the output signal data.

A designer or the like produces the output signal data indicative of the selection of the resistance and capacitance model for the output signals required to take the wiring resistances into consideration for delay calculation, whereby the step of outputting the model selection result provides indication of the resistance and capacitance model for a minimum number of output lines required.

Consequently, the step of calculating the delay time automatically performs the delay time calculation for the resistance and capacitance model upon the output lines required to taken the wiring resistances into consideration for delay calculation and the cells having the output lines, and performs the delay time calculation for the capacitance model upon other cells and the output lines thereof, thereby permitting high speed calculation of the accurate delay time.

In a still further aspect of the present invention, the method of calculating a delay time comprises the steps of: receiving circuit connection data specifying a circuit to be verified by describing a plurality of cells each having a predetermined logic function and providing an output signal driven by a transistor and connection between the plurality of cells, and layout data specifying a layout pattern of the circuit to be verified, and extracting cell-to-cell interconnecting lines in the circuit to be verified and parasitic capacitances and parasitic resistances on the lines on the basis of the circuit connection data and the layout data, to output capacitance model data in which the parasitic capacitances correspond respectively to a plurality of output lines carrying the output signals from the plurality of cells in the circuit to be verified, and resistance and capacitance model data in which the parasitic capacitances and the parasitic resistances correspond respectively to the plurality of output lines; providing signal path data indicative of a signal path provided on the circuit to be verified and selecting one of a resistance and capacitance model and a capacitance model; outputting a model selection result indicative of the resistance and capacitance model for all output lines lying on the signal path for which selection of the resistance and capacitance model is indicated among the plurality of output lines in the circuit to be verified on the basis of the circuit connection data and the signal path data; inserting a wiring delay element into the output lines for which the model selection result indicates the resistance and capacitance model among the plurality of output lines in the circuit to be verified on the basis of the circuit connection data and the model selection result, to output wiring delay element inserted circuit connection data; and calculating the delay time for the output lines in which the wiring delay element is inserted and cells having the output lines by using the resistance and capacitance model data and a predetermined resistance and capacitance dependent delay calculating formula, and calculating the delay time for output lines in which the wiring delay element is not inserted and cells having the output lines by using the capacitance model data and a predetermined capacitance dependent delay calculating formula, on the basis of the capacitance model data, the resistance and capacitance model data, and the wiring delay element inserted circuit connection data.

This method comprising the step of providing the signal path data indicative of the signal path on the circuit to be verified selecting one of the resistance and capacitance model and the capacitance model, and the step of outputting the model selection result indicative of the resistance and capacitance model for all output lines lying on the signal path indicating the resistance and capacitance model among the plurality of output lines in the circuit to be verified on the basis of the circuit connection data and the signal path data.

A designer or the like produces the signal path data indicative of the resistance and capacitance model for the signal path required to take the wiring resistances into consideration for delay calculation, whereby the step of outputting the model selection result provides indication of the resistance and capacitance model for a minimum number of output lines required on the signal path indicated by the signal path data.

Consequently, the step of calculating the delay time automatically performs the delay time calculation for the resistance and capacitance model upon the output lines required to take the wiring resistances into consideration for delay calculation and the cells having the output lines, and performs the delay time calculation for the capacitance model upon other cells and the output lines thereof, thereby permitting high speed calculation of the accurate delay time.

In addition, the models to be selected for all output lines on the signal path are determined only by indicating the signal path by the signal path data, thereby permitting designation of the models to be selected relatively easily.

It is an object of the present invention to provide a device and method for calculating an accurate delay time at high speeds.

These and other objects, features, aspects and advantages of the present invention will become more apparent from the following detailed description of the present invention when taken in conjunction with the accompanying drawings.

BRIEF DESCRIPTION OF THE DRAWINGS

FIG. 6 illustrates an example of subline-by-subline wiring resistance and capacitance data on a layout;

FIG. 9 illustrates an example of an RC model output result;

FIG. 10 illustrates an example of subline-by-subline line length data on a layout;

FIG. 11 illustrates an example of line length data;

FIG. 12 illustrates an example of a cell-by-cell delay parameter library;

DESCRIPTION OF THE PREFERRED EMBODIMENTS

<First Preferred Embodiment>

Figure 1:
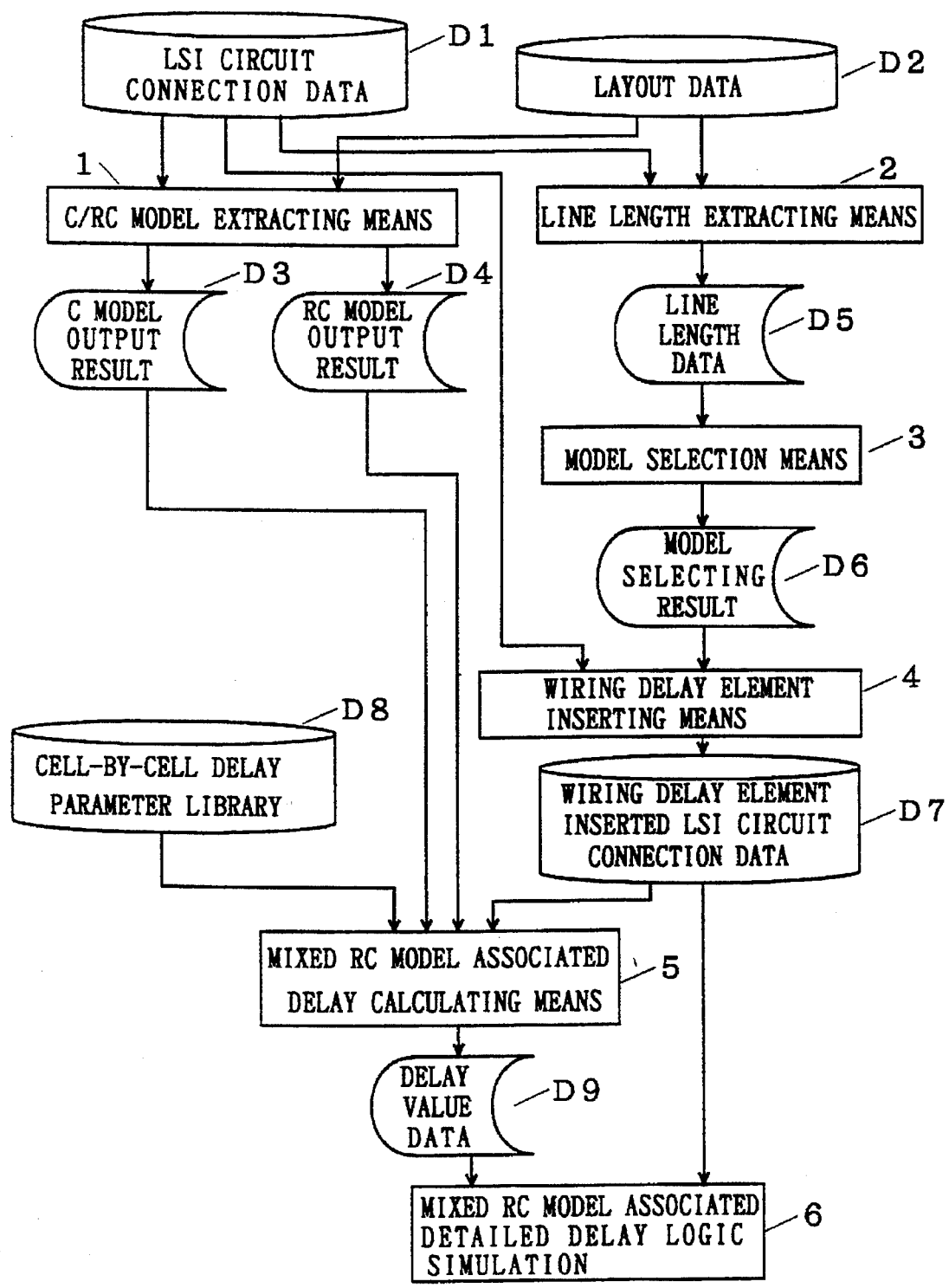
FIG. 1 is a block diagram of a delay time calculating device according to a first preferred embodiment of the present invention.

FIG. 1 is a block diagram of a delay time calculating device according to a first preferred embodiment of the present invention.

As shown in FIG. 1, LSI circuit connection data D1 for specifying an LSI circuit to be verified by describing cells having predetermined logic functions and connection therebetween is applied to a C/RC model extracting means 1, a line length extracting means 2, and a wiring delay element inserting means 4 by an LSI circuit connection data providing means not shown.

Layout data D2 specifying a layout pattern of the LSI circuit to be verified which is specified by the LSI circuit connection data D1 is applied to the C/RC model extracting means 1 and the line length extracting means 2 by a layout data providing means not shown.

The C/RC model extracting means 1 extracts parasitic wiring resistances and capacitances serving as loads upon cell-to-cell interconnecting lines from the LSI circuit connection data D1 and the layout data D2 on the basis of cell-to-cell wiring data (polygon data). The C/RC model extracting means 1 then outputs to a mixed RC model associated delay calculating means 5 a C model output result D3 having a predetermined file format in which only the parasitic wiring capacitances among the extracted wiring resistances and capacitances correspond respectively to a plurality of output lines carrying output signals from a plurality of cells in the LSI circuit specified by the LSI circuit connection data D1, and an RC model output result D4 having a predetermined file format in which the parasitic wiring resistances and capacitances correspond respectively to the plurality of output lines.

Figure 2:
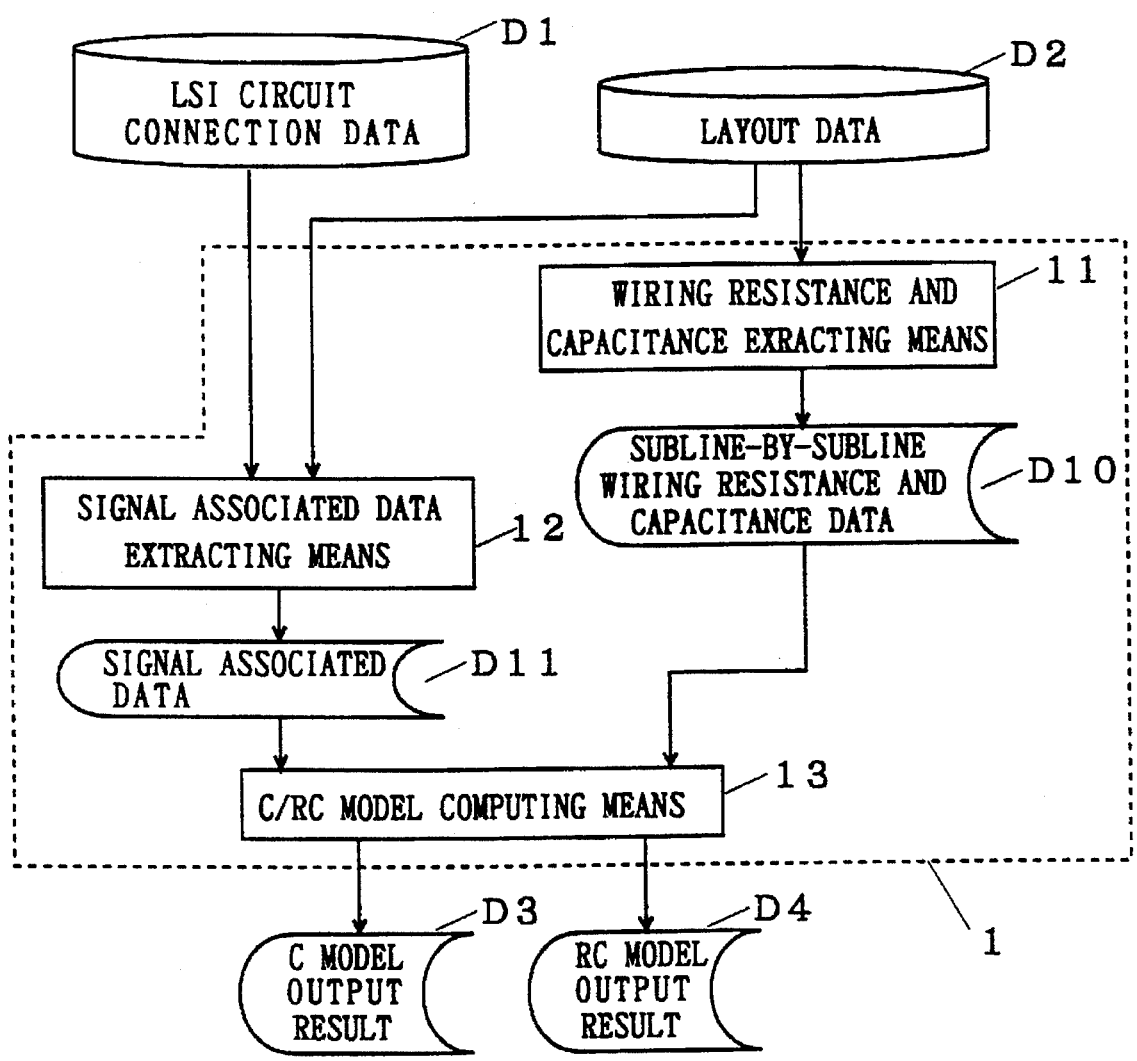
FIG. 2 is a block diagram showing the internal construction of a C/RC model extracting means shown in FIG. 1.

FIG. 2 is a block diagram showing the internal construction of the C/RC model extracting means 1. As shown in FIG. 2, the C/RC model extracting means 1 includes a wiring resistance and capacitance extracting means 11, a signal associated data extracting means 12, and a C/RC model computing means 13.

The wiring resistance and capacitance extracting means 11 receives the layout data D2 and extracts from the layout data D2 a wiring capacitance and a wiring resistance for each sub-line into which the lines are divided at each branch point, to output to the C/RC model computing means 13 subline-by-subline wiring resistance and capacitance data D10 in which the wiring capacitances and the wiring resistances are described in corresponding relation to the respective sub-lines.

Figure 5:
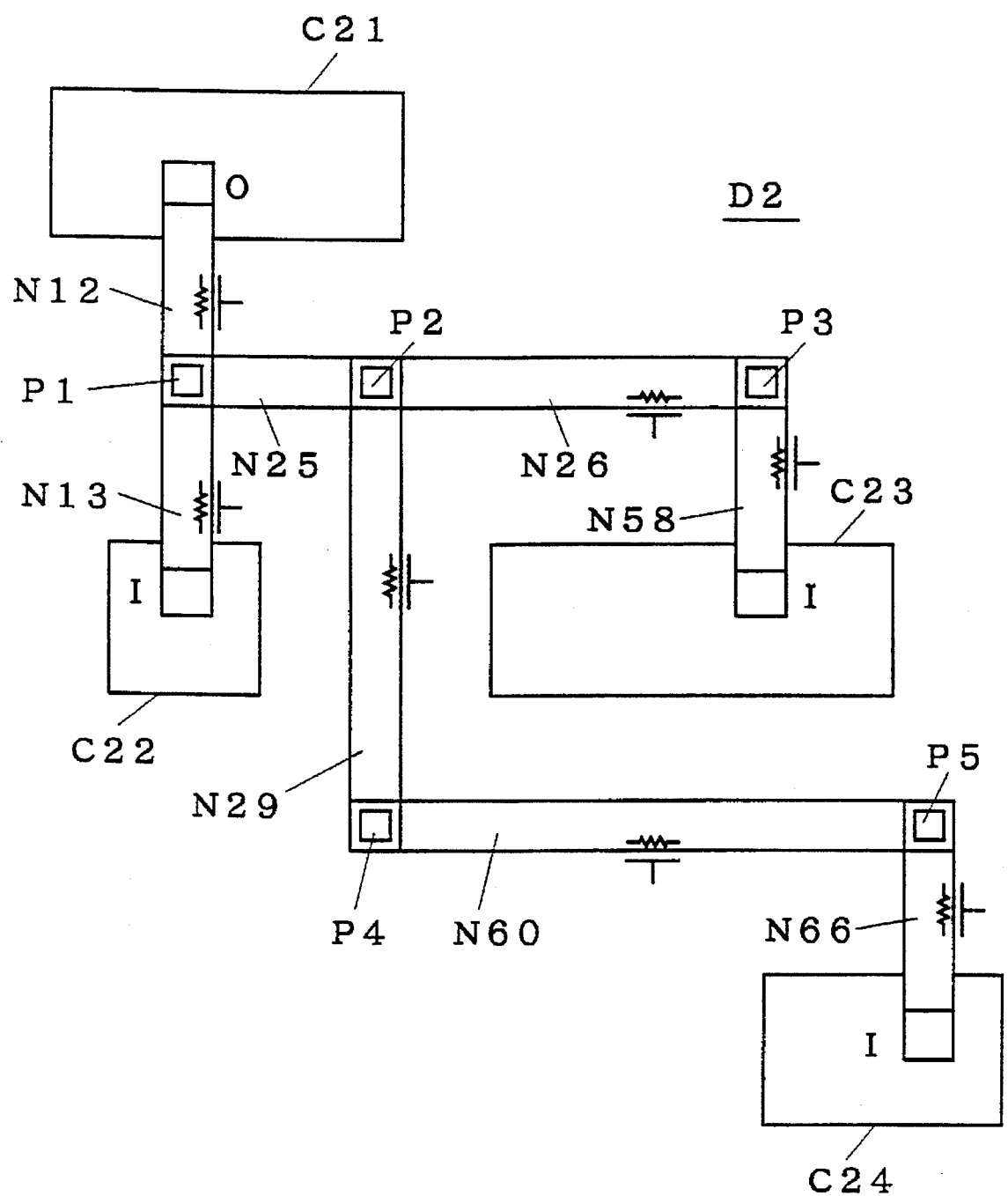
FIG. 5 illustrates an exemplary layout pattern having a plurality of cells.

FIG. 5 illustrates an example of the layout data D2. FIG. 6 illustrates the subline-by-subline wiring resistance and capacitance data D10 corresponding to the layout pattern of FIG. 5.

Referring to FIG. 5, signalling lines for interconnecting cells C21 to C24 include sub-lines N12, N13, N25, N26, N29, N58, N60, N66 divided by branch portions P1 to P5, the sub-line N12 being formed between the cell C21 and the branch portion P1, the sub-line N13 between the cell C22 and the branch portion P1, the sub-line N25 between the branch portions P1 and P2, the sub-line N26 between the branch portions P2 and P3, the sub-line N29 between the branch portions P2 and P4, the sub-line N60 between the branch portions P4 and P5, the sub-line N58 between the branch portion P3 and the cell C23, the sub-line N66 between the branch portion P5 and the cell C24.

The wiring resistance and capacitance extracting means 11 produces from the layout data D2 shown in FIG. 5 the subline-by-subline wiring resistance and capacitance data D10 in which the wiring capacitances and the wiring resistances are described in corresponding relation to the respective sub-lines as shown in FIG. 6.

Referring again to FIG. 2, the signal associated data extracting means 12 receives the LSI circuit connection data D1 and the layout data D2, and outputs to the C/RC model computing means 13 signal associated data D11 in which the sublines on the layout data D2 are described corresponding to the signalling lines connecting the input and output of two cells in the LSI circuit specified by the LSI circuit connection data D1. For example, the signal associated data extracting means 12 outputs the signal associated data D11 shown in FIG. 7 for the LSI circuit shown in FIG. 5. It will be understood from FIG. 7 that the term "signalling line" herein means a line from the output of a cell to the input of another cell.

The C/RC model computing means 13 receives the subline-by-subline wiring resistance and capacitance data D10 and the signal associated data D11, and outputs the C model output result D3 in which the wiring capacitances are described in corresponding relation to the respective signals and the RC model output result D4 in which the wiring capacitances and the wiring resistances are described in corresponding relation to the respective signals.

Figures 7, 8:
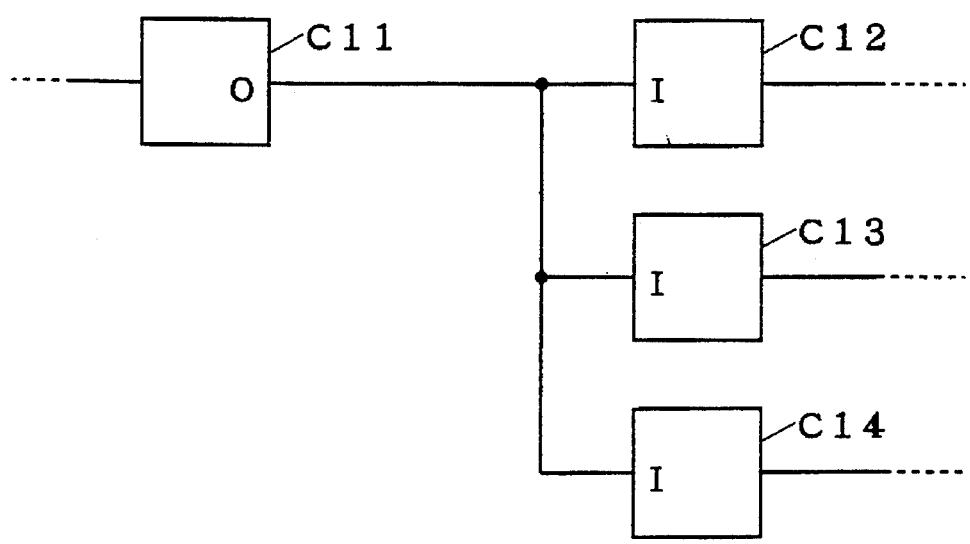
FIG. 7 illustrates an example of signal associated data.
FIG. 8 illustrates an exemplary circuit including a plurality of cells.

FIG. 8 illustrates an exemplary circuit including a plurality of cells, and FIG. 9 illustrates the RC model output result D4 for the circuit of FIG. 8.

Referring to FIG. 8, the output O of a cell C11 is connected to the respective inputs I of cells C12 to C14. For such a circuit, the RC model output result D4 shown in FIG. 9 is described. In FIG. 9, the output signal of the cell C11 is defined as an output signal name on the first row, and the total capacitance is described on the second row, the total resistance being described on the third row. On the fourth and following rows are described RC time constants of the respective cells C12 to C14 driven by the output signal from the cell C11.

Referring again to FIG. 1, the line length extracting means 2 receives the LSI circuit connection data D1 and the layout data D2, and establishes a correspondence between the line length data extracted from the layout data D2 and the respective output lines in the LSI circuit specified by the LSI circuit connection data D1, to output the line length data D5 to a model selecting means 3.

Figure 3:
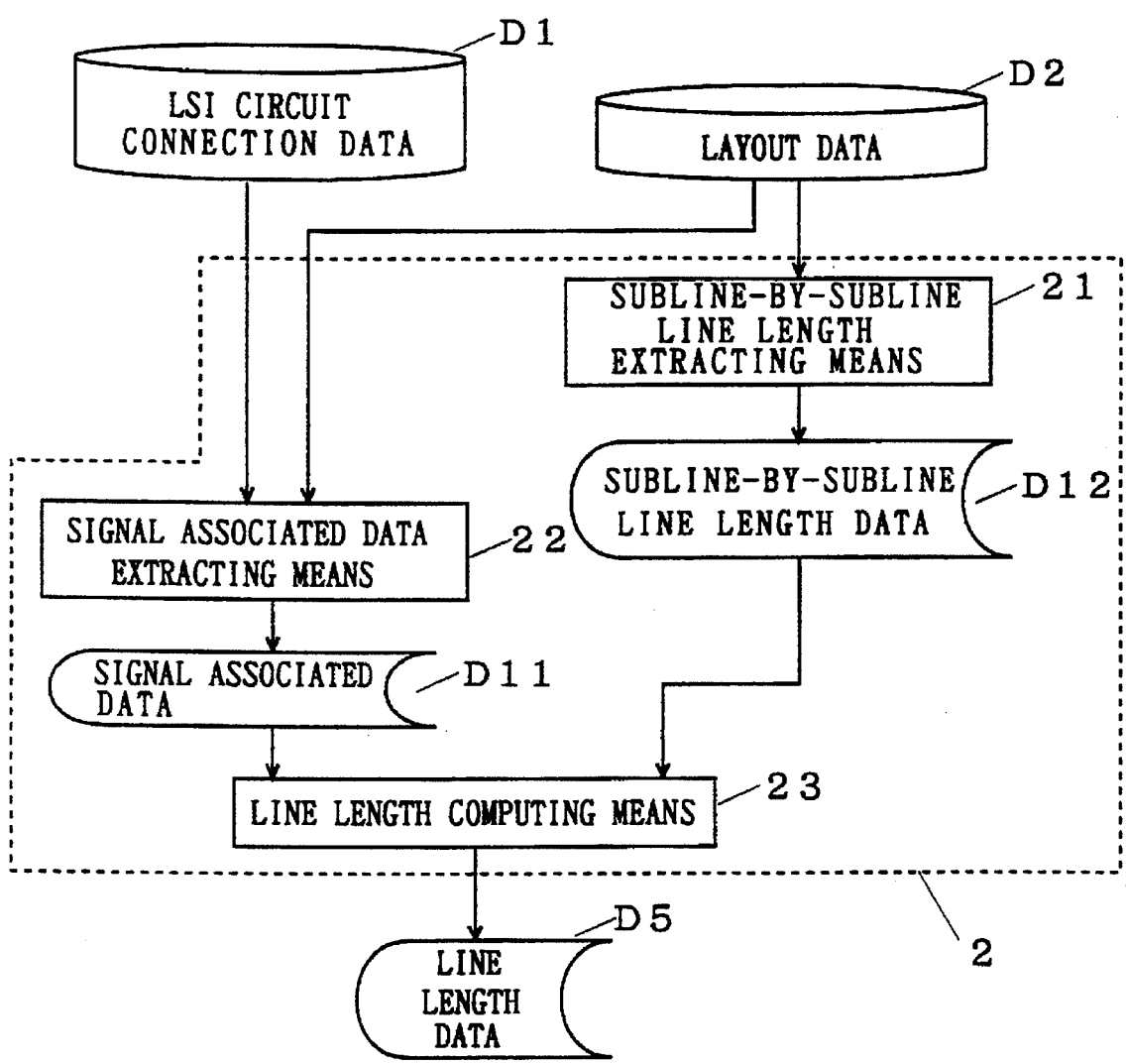
FIG. 3 is a block diagram showing the internal construction of a line length extracting means shown in FIG. 1.

FIG. 3 is a block diagram showing the internal construction of the line length extracting means 2. As shown in FIG. 3, the line length extracting means 2 includes a subline-by-subline line length extracting means 21, a signal associated data extracting means 22, and a line length data computing means 23.

The subline-by-subline line length extracting means 21 extracts the line lengths and wiring layers corresponding respectively to the sub-lines into which the lines are divided at the branch points and then outputs subline-by-subline line length data D12 to the line length data computing means 23.

For example, when the layout data D2 is provided as shown in FIG. 5, the subline-by-subline line length data D12 shown in FIG. 10 is outputted. In FIG. 10, the reference character AL1 designates a first aluminum layer, and AL2 designates a second aluminum layer.

The signal associated data extracting means 22, similar to the signal associated data extracting means 12, extracts the sub-lines on the layout data D2 corresponding to the signalling lines between the inputs and outputs of the plurality of cells in the LSI circuit specified by the LSI circuit connection data D1, as shown in FIG. 7, on the basis of the LSI circuit connection data D1 and the layout data D2, and outputs the signal associated data D11 to the line length data computing means 23.

The line length data computing means 23 computes the line length of the output lines corresponding to the output signal names in the LSI circuit specified by the LSI circuit connection data D1 on the basis of the signal associated data D11 and subline-by-subline line length data D12, and then outputs the line length data D5 in which the line lengths of the wiring layers and total line length are described corresponding to each of the output signal names (output line names) as shown in FIG. 11.

In this manner, the line length data computing means 23 is based on the subline-by-subline line length data D12 to compute the accurate line lengths of the respective wiring layers and the total line length in corresponding relation to each of the output lines.

Referring again to FIG. 1, the model selecting means 3 compares the total line length of the respective output lines (output signals) with a predetermined reference line length SL on the basis of the line length data D5. The model selecting means 3 selects the RC model for the output lines having the total line length greater than the reference line length SL and selects the C model for the output lines having the total line length less than the reference line length SL, to output to the wiring delay element inserting means 4 a model selection result D6 in which the selected model names correspond to the output signal names.

The wiring delay element inserting mean 4 recognizes the output lines for which the RC model is selected on the basis of the model selection result D6 and inserting wiring delay elements into the output lines for which the RC model is selected in the LSI circuit specified by the LSI circuit connection data D1, to output wiring delay element inserted LSI circuit connection data D7 to the mixed RC model associated delay calculating means 5.

A cell-by-cell delay parameter library D8 including a group of delay parameters specifying the delay time cell by cell is applied to the mixed RC model associated delay calculating means 5 by a cell-by-cell delay parameter library providing means not shown.

FIG. 12 illustrates an exemplary part of the cell-by-cell delay parameter library D8. Referring to FIG. 12, a cell function name is specified on the first row, an input on the second row, an output on the third row. Parameters specifying a rise time are described on the fourth row, parameters specifying a fall time on the fifth row, the drive capacity of the rising and falling on the sixth row, a cell load capacitance on the seventh row, a fan-out on the eighth row, and an input/output capacitance on the ninth row.

The mixed RC model associated delay calculating means 5 receives the C model output result D3, the RC model output result D4, the wiring delay element inserted LSI circuit connection data D7, and the cell-by-cell delay parameter library D8. The mixed RC model associated delay calculating means 5 performs a delay calculation for the RC model upon the output lines into which the wiring delay element is inserted and the cells driving the output lines by using an existing resistance and capacitance data dependent delay calculating formula on the basis of the RC model output result D4 and the cell-by-cell delay parameter library D8, and performs a delay calculation upon the cells driving the signals having no inserted wiring delay element by using an existing capacitance dependent delay calculating formula on the basis of the C model output result D3 and the cell-by-cell delay parameter library D8, to output delay value data D9.

Figures 13, 14:
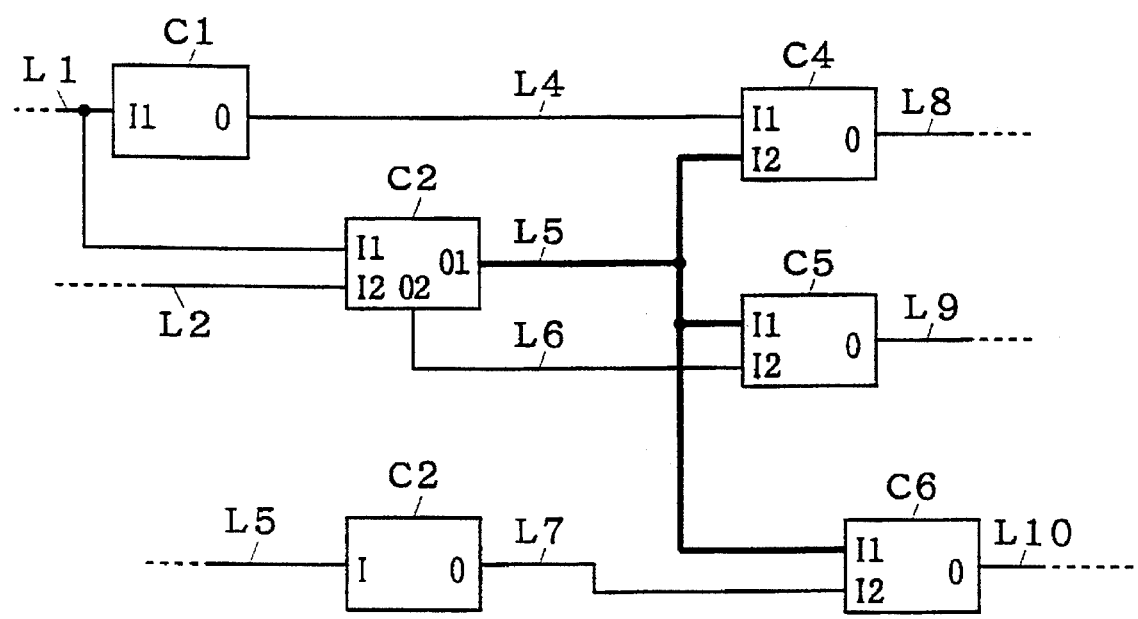
FIG. 13 illustrates an example of capacitance dependent delay calculating formulas.
FIG. 14 illustrates operation of a model selecting means.

FIG. 13 illustrates examples of the capacitance dependent delay calculating formulas. As shown in FIG. 13, a rise delay time Td(rise) is specified by Formula (1), and a fall delay time Td(fall) is specified by Formula (2). In Formula (1), Cin represents a normalized input capacitance, Cout represents a normalized output capacitance, and K1(r) to K4(r) represent rising parameters. In Formula (2), Cin represents a normalized input capacitance, Cout represents a normalized output capacitance, and K1(f) to K4(f) represent falling parameters.

In this manner, the mixed RC model associated delay calculating means 5 applies the delay parameter group of the cell-by-cell delay parameter library D8 to the capacitance dependent delay calculating formula or the resistance and capacitance dependent delay calculating formula to calculate the delay time, thereby providing more sophisticated delay calculation with increased delay time calculating accuracy.

A mixed RC model associated detailed delay logic simulation 6 executes detailed delay logic simulation associated with the mixed C and RC models on the basis of the wiring delay element inserted LSI circuit connection data D7 and the delay value data D9. The simulation associated with the mixed C and RC models means herein that simulation is permitted for all elements and all signals in the LSI circuit connection data D1 independently of the presence/absence of the wiring delay elements (independently of mixture of the C model and the RC model) and is sufficiently achieved by the existing simulation technique.

Figure 4:
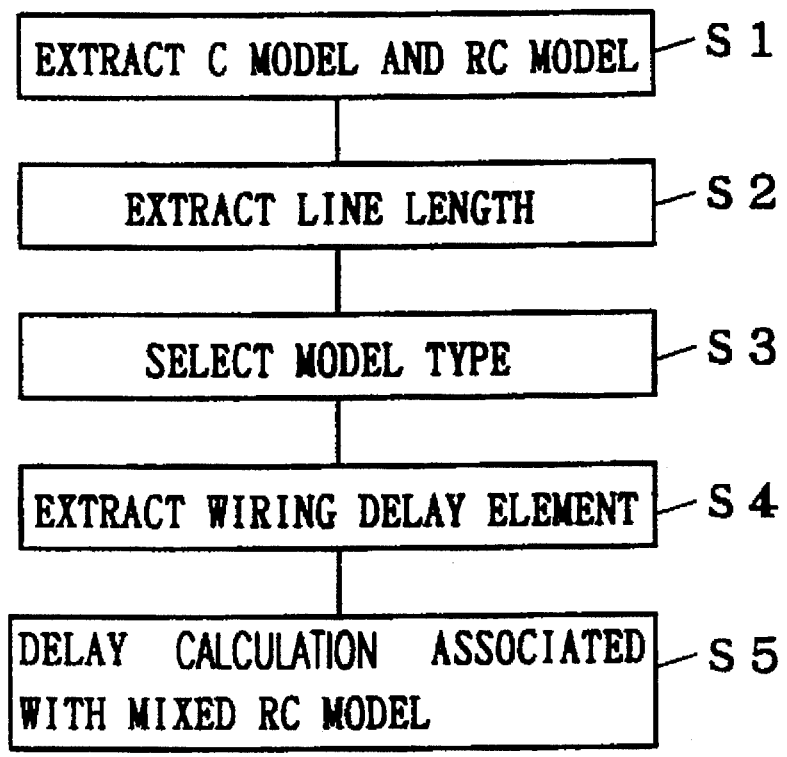
FIG. 4 is a flow chart showing a delay time calculating method by the delay time calculating device of the first preferred embodiment.

FIG. 4 is a flow chart showing a method of calculating the delay time by the delay time calculating device of the first preferred embodiment shown in FIGS. 1 to 3.

Referring to FIG. 4, the C/RC model extracting means 1 receives the LSI circuit connection data D1 and the layout data D2, and extracts the cell-to-cell interconnecting lines and the parasitic wiring resistances and capacitances serving as loads upon the lines from the LSI circuit connection data D1 and the layout data D2 in the step S1. Then the C/RC model extracting means 1 outputs to the mixed RC model associated delay calculating means 5 the C model output result D3 in which only the parasitic wiring capacitances among the extracted wiring resistances and capacitances correspond respectively to the plurality of output lines carrying the output signals from the plurality of cells in the LSI circuit specified by the LSI circuit connection data D1, and the RC model output result D4 in which the parasitic wiring resistances and capacitances correspond respectively to the plurality of output lines.

In the step S2, the line length extracting means 2 receives the LSI circuit connection data D1 and the layout data D2, and establishes the correspondence between the line length data extracted from the layout data D2 and the output lines in the LSI circuit specified by the LSI circuit connection data D1, to output the line length data D5 to the model selecting means 3.

In the step S3, the model selecting means 3 compares the total line length of the respective output lines with the predetermined reference line length SL on the basis of the line length data D5. The model selecting means 3 then selects the RC model for the output lines having the total line length greater than the reference line length SL and selects the C model for the output lines having the total line length less than the reference line length SL, to output to the wiring delay element inserting means 4 the model selection result D6 in which the selected model names correspond to the signal names.

For example, in an LSI circuit including cells C1 to C6 and lines L1 to L10 as shown in FIG. 14, if the model selecting means 3 selects the RC model only for the output line from a first output O1 of the cell C2, the selection of the RC model is made for the line L5 for connecting the first output O1 of the cell C2 to a second input I2 of the cell C4, a first input I1 of the cell C5, and a first input I1 of the cell C6 and the selection of the C model is made for other lines L1 to L4 and L6 to L10.

Then, in the step S4, the wiring delay element inserting means 4 recognizes the output signals for which the RC model is selected on the basis of the model selection result D6 and inserts the wiring delay elements into the output lines for which the RC model is selected in the LSI circuit specified by the LSI circuit connection data D1 to output the wiring delay element inserted LSI circuit connection data D7 to the mixed RC model associated delay calculating means 5.

Figure 15:
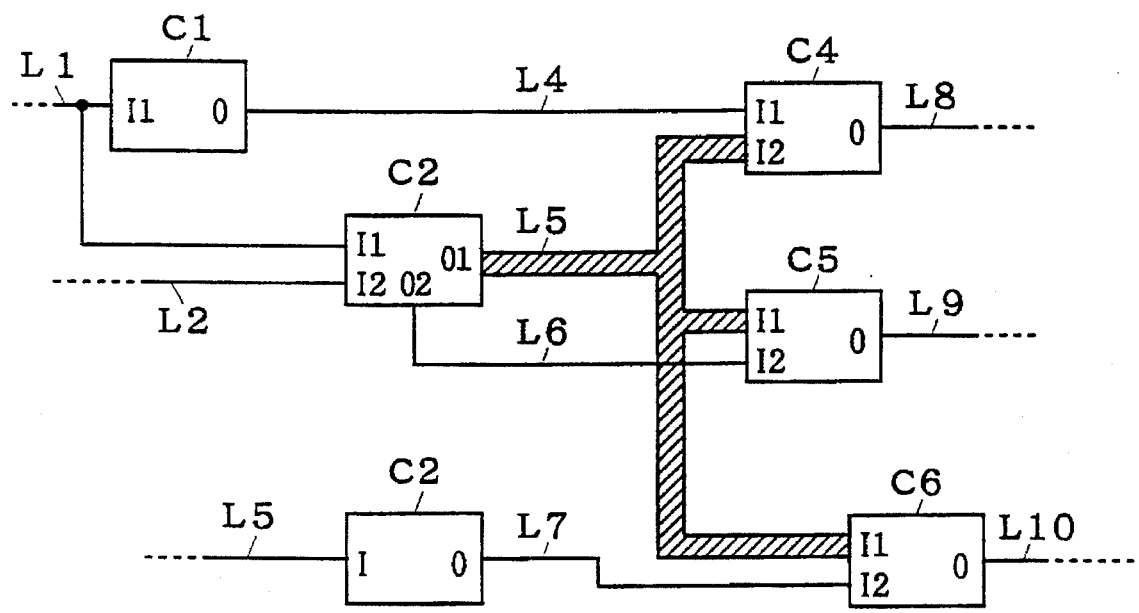
FIG. 15 illustrates operation of a wiring delay element inserting means.

For example, when the RC model is selected only for the line L5 as shown in FIG. 14, the wiring delay element inserting means 4 inserts the wiring delay element only into the line L5 as shown in FIG. 15.

In the step S5, the mixed RC model associated delay calculating means 5 receives the C mode output result D3, the RC model output result D4, the wiring delay element inserted LSI circuit connection data D7, and the cell-by-cell delay parameter library D8. The mixed RC model associated delay calculating means 5 executes the delay value calculation for the RC model upon the output lines in which the wiring delay element is inserted and the cells driving the output lines by using the existing resistance and capacitance data dependent delay calculating formula on the basis of the RC model output result D4 and the cell-by-cell delay parameter library D8, and executes the delay calculation upon the output lines in which the wiring delay element is not inserted and the cells driving the output lines by using the existing capacitance dependent delay calculating formula on the basis of the C model output result D3 and the cell-by-cell delay parameter library D8, to output the delay value data D9.

In this manner, the delay time calculating device of the first preferred embodiment inserts the wiring delay element into the output line in the LSI circuit specified by the LSI circuit connection data D1 which line has the total line length greater than the reference line length SL so that it is judged that the delay time due to the wiring resistance thereof is not negligible, to execute the C model and RC model mixed delay value calculation upon the output line.

Thus, the delay time is calculated, while a minimum number of wiring delay elements to be inserted are required, without deterioration of the calculation accuracy as compared with calculation wherein the wiring delay elements are inserted into all lines. This provides for high-speed calculation of an accurate delay time.

Consequently, the simulation time by the mixed RC model associated detailed delay logic simulation 6 is held at a practical level, and the logic verification time is prevented from being prolonged.

Although the model selecting means 3 performs the C/RC model selection on the basis of the total line length of the respective output signals, the C/RC model selection may be performed on the basis of the line length of layers having particular heights.

<Second Preferred Embodiment>

Figure 16:
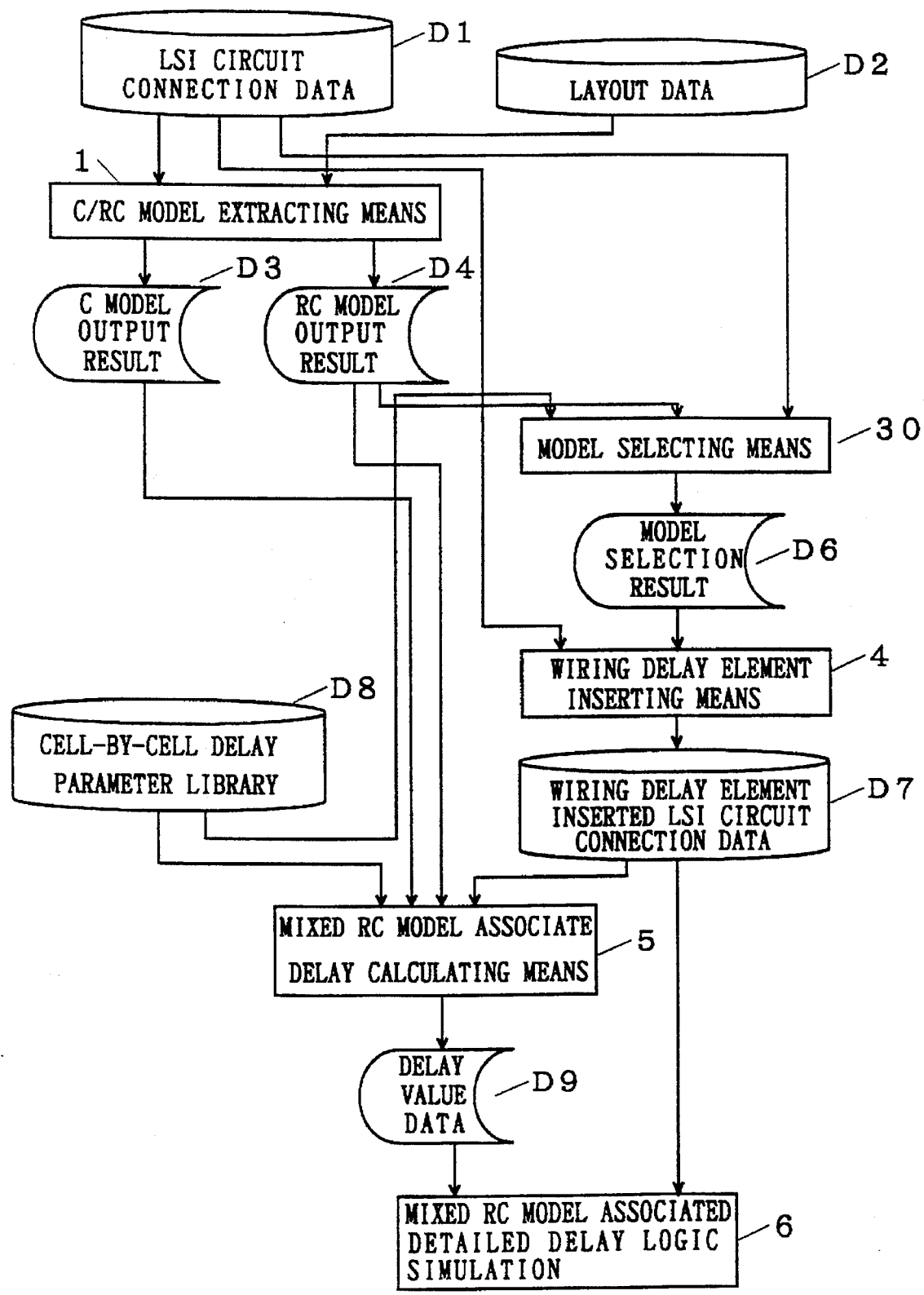
FIG. 16 is a block diagram of the delay time calculating device according to a second preferred embodiment of the present invention.

FIG. 16 is a block diagram of the delay time calculating device according to a second preferred embodiment of the present invention. As shown in FIG. 16, a model selecting means 30 receives the LSI circuit connection data D1, the RC model output result D4, and the cell-by-cell delay parameter library D8, and outputs to the wiring delay element inserting means 4 the model selection result D6 in which the selected model names correspond to the output lines on the basis of an on-resistance of the transistor driving the signal for each cell.

Other constructions and resultant effects of the delay time calculating device of the second preferred embodiment are similar to those of the first preferred embodiment except that the line length extracting means 2 and its output data or the line length data D5 are not provided in the second preferred embodiment, and the description thereof will be omitted herein. The model selecting means 30 will be detailed hereinafter.

Figure 17:
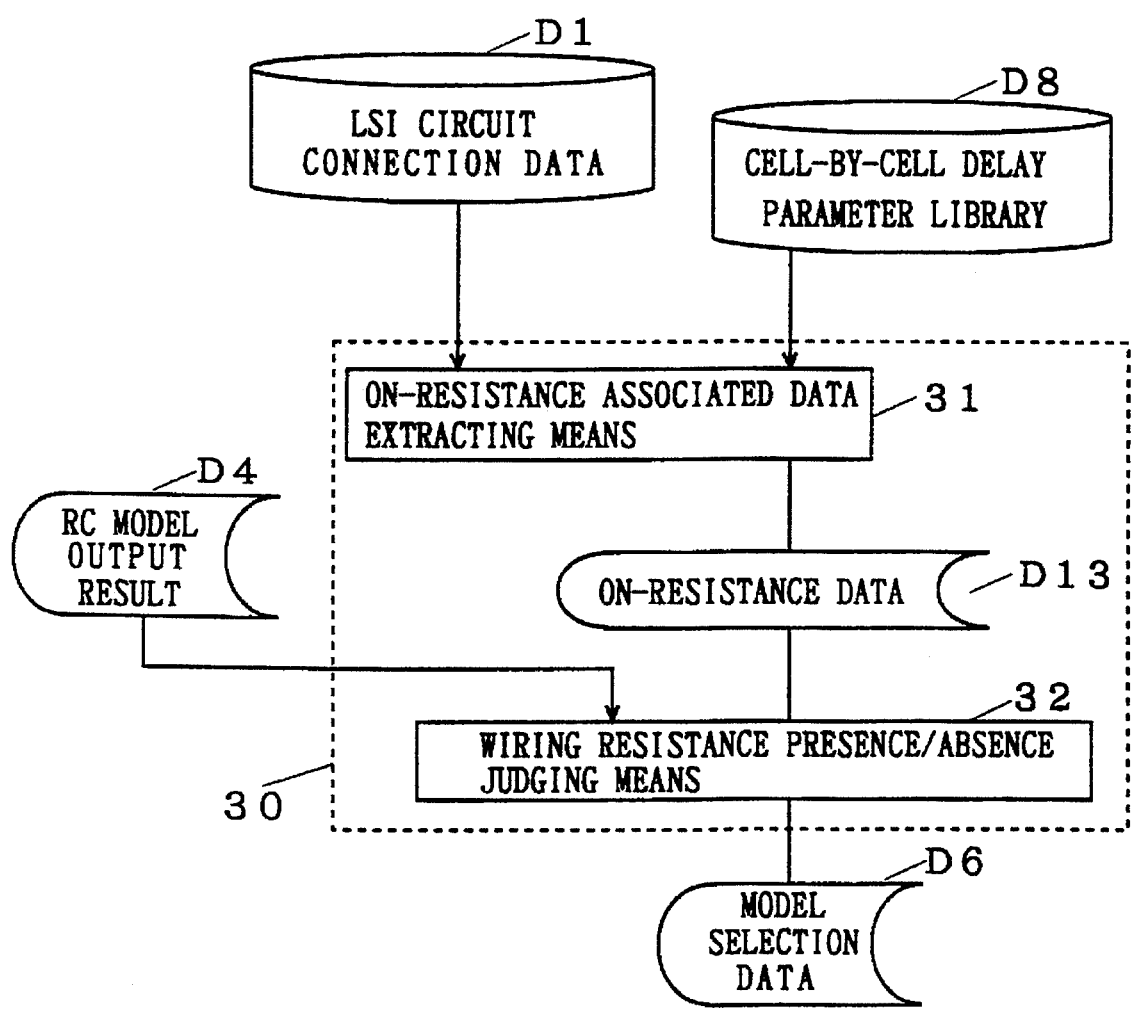
FIG. 17 is a block diagram showing the internal construction of the model selecting means of FIG. 16.

FIG. 17 is a block diagram showing the internal construction of the model selecting means 30. As shown in FIG. 17, an on-resistance associated data extracting means 31 extracts the on-resistances of the transistors in the cells driving output signals from all output lines in the LSI circuit specified by the LSI circuit connection data D1 on the basis of the LSI circuit connection data D1 and the cell-by-cell delay parameter library D8, and outputs to a wiring resistance presence/absence judging means 32 on-resistance data D13 in which the on-resistances are described in corresponding relation to the output lines.

The cell-by-cell delay parameter library D8 has the parameters of the output drive capacity of the cell (for example, row 6 of FIG. 12) in addition to the delay parameter group. The on-resistance associated data extracting means 31 can extract the on-resistances by using the parameters.

The wiring resistance presence/absence judging means 32 calculates the resistance ratio RR (=LR/RON) of the wiring resistance LR to the on-resistance RON for each output line on the basis of the RC model output result D4 and the on-resistance data D13. The wiring resistance presence/absence judging means 32 selects the RC model for the output lines having the resistance ratio RR greater than a predetermined reference resistance ratio SR, and selects the C model for the signals having the resistance ratio RR less than the reference resistance ratio SR, to output to the wiring delay element inserting means 4 the model selection result D6 in which the selected model names correspond to the output lines.

Figure 18:
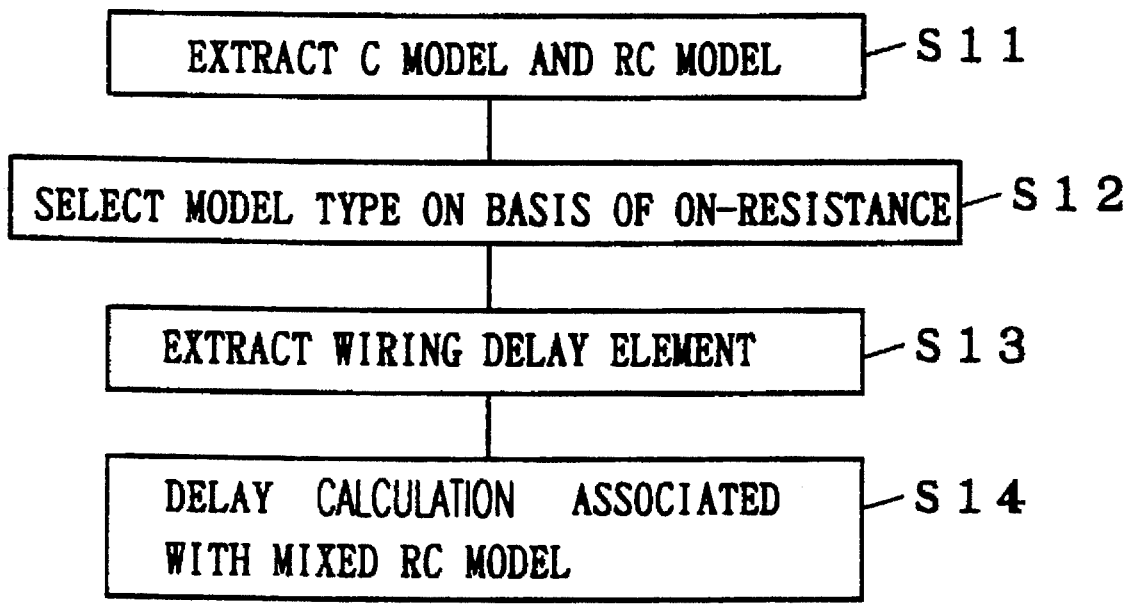
FIG. 18 is a flow chart showing the delay time calculating method by the delay time calculating device of the second preferred embodiment.

FIG. 18 is a flow chart showing the method of calculating the delay time by the delay time calculating device of the second preferred embodiment.

Referring to FIG. 18, in the step S11, the C/RC model extracting means 1 extracts the cell-to-cell interconnecting lines and the parasitic wiring resistances and capacitances serving as loads upon the lines from the LSI circuit connection data D1 and the layout data D2. The C/RC model extracting means 1 then outputs to the mixed RC model associated delay calculating means 5 the C model output result D3 in which only the parasitic wiring capacitances among the extracted parasitic wiring resistances and capacitances correspond respectively to the plurality of output lines carrying the output signals from the plurality of cells in the LSI circuit specified by the LSI circuit connection data D1, and outputs to the mixed RC model associated delay calculating means 5 the RC model output result D4 in which the parasitic wiring resistances and capacitances correspond respectively to the plurality of output lines.

In the step S12, the model selecting means 30 receives the LSI circuit connection data D1, the RC model output result D4, and the cell-by-cell delay parameter library D8, and outputs to the wiring delay element inserting means 4 the model selection result D6 in which the selected model names correspond to the signal names on the basis of the on-resistances of the transistors in each cell driving the output lines (output signals).

Then, in the step S13, the wiring delay element inserting means 4 recognizes the output lines for which the RC model is selected on the basis of the model selection result D6, and inserts the wiring delay elements into the output lines for which the RC model is selected in the LSI circuit specified by the LSI circuit connection data D1, to output the wiring delay element inserted LSI circuit connection data D7 to the mixed RC model associated delay calculating means 5.

In the step S14, the mixed RC model associated delay calculating means 5 receives the C model output result D3, the RC model output result D4, the wiring delay element inserted LSI circuit connection data D7, and the cell-by-cell delay parameter library D8. The mixed RC model associated delay calculating means 5 performs the delay value calculation for the RC model upon the output line in which the wiring delay element is inserted and the cells driving the output lines by using the existing resistance and capacitance data dependent delay calculating formula on the basis of the RC model output result D4 and the delay parameter group in the cell-by-cell delay parameter library D8, and performs the delay calculation upon the output signals in which the wiring delay element is not inserted and the cells driving the output signals by using the existing capacitance dependent delay calculating formula on the basis of the C model output result D3 and the delay parameter group in the cell-by-cell delay parameter library D8, to output the delay value data D9.

As above stated, the delay time calculating device of the second preferred embodiment inserts the wiring delay element into the output line in the LSI circuit specified by the LSI circuit connection data D1 which line has the resistance ratio RR (=LR/RON) of the wiring resistance LR to the on-resistance RON greater than the reference resistance ratio SR, which indicates that the wiring resistance is high relative to the on-resistance, so that it is judged that the delay time due to the wiring resistance is not negligible, to perform the C model and RC model mixed delay value calculation.

The second preferred embodiment provides for delay time calculation without deterioration of the calculation accuracy as compared with calculation wherein the wiring delay elements are inserted into all lines, while a minimum number of wiring delay elements to be inserted are required, thereby permitting high-speed calculation of an accurate delay time.

Consequently, the simulation time by the mixed RC model associated detailed delay logic simulation 6 is held at a practical level, and the logic verification time is prevented from being prolonged.

Although the wiring resistance presence/absence judging means 32 of the second preferred embodiment uses the resistance ratio RR as the model selection reference, the present invention is not limited thereto. The model selection reference may be other values derived from the wiring resistance LR and the on-resistance RON.

<Third Preferred Embodiment>

Figure 19:
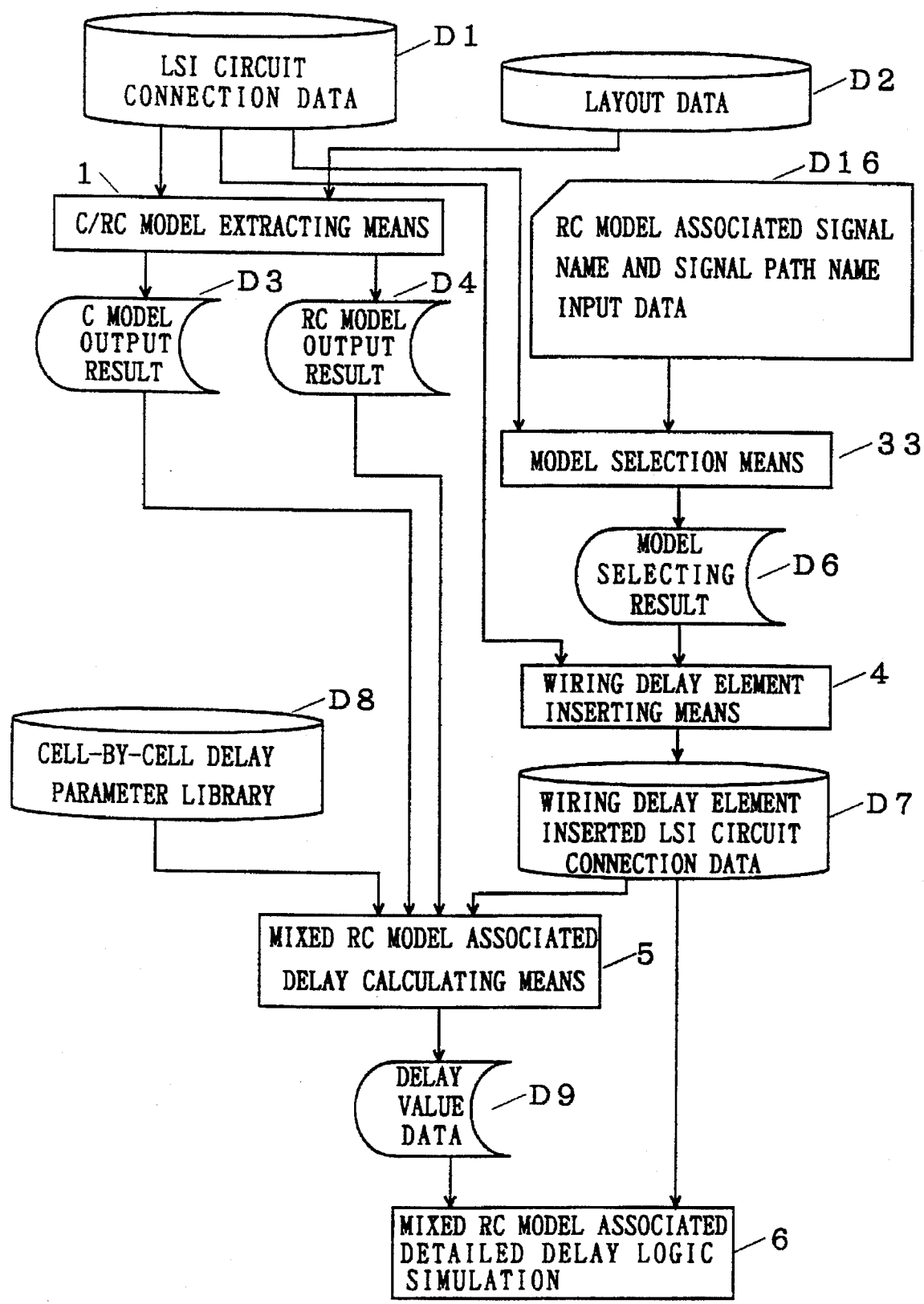
FIG. 19 is a block diagram of the delay time calculating device according to a third preferred embodiment of the present invention.

FIG. 19 is a block diagram of the delay time calculating device according to a third preferred embodiment of the present invention. Referring to FIG. 19, a model selecting means 33 receives the LSI circuit connection data D1 and RC model associated signal name and signal path name input data D16 in which output signal names or signal path names indicative of selection of the RC model are described, from the LSI circuit connection data providing means not shown and RC model associated signal name and signal path name input data providing means not shown, respectively.

The model selecting means 33 outputs to the wiring delay element inserting means 4 the model selection result D6 in which the selected model names correspond to the respective output lines in the LSI circuit specified by the LSI circuit connection data D1 in accordance with the indication of the RC model associated signal name and signal path name input data D16.

Other constructions and resultant effects of the delay time calculating device of the third preferred embodiment are similar to those of the delay time calculating device of the first preferred embodiment except that the line length extracting means 2 and its output data or the line length data D5 are not provided in the third preferred embodiment, and the description thereof will be omitted herein. The model selecting means 33 will be detailed hereinafter.

Figure 21:
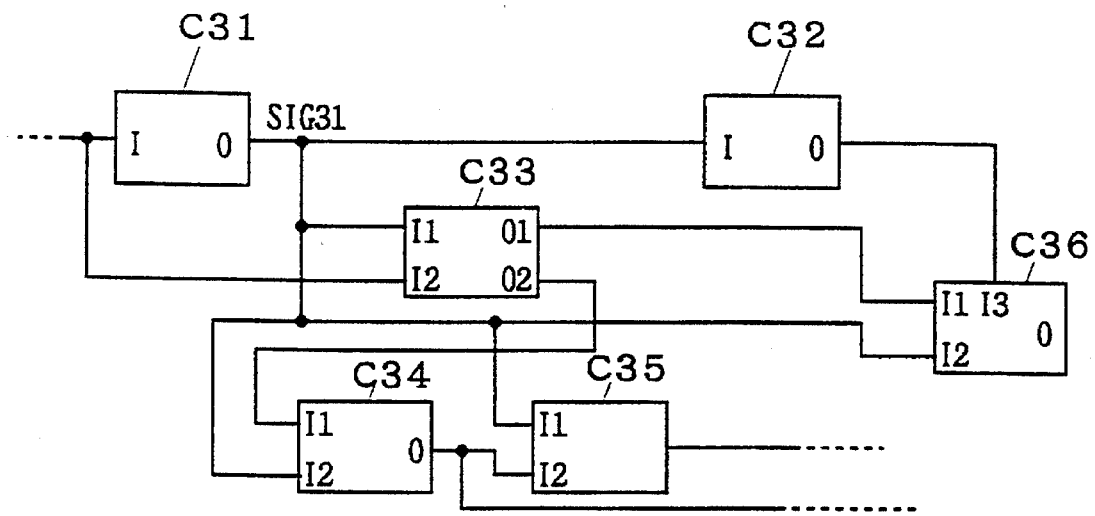
FIGS. 21, 23 and 24 illustrate operation of the model selecting means.
Figure 22:
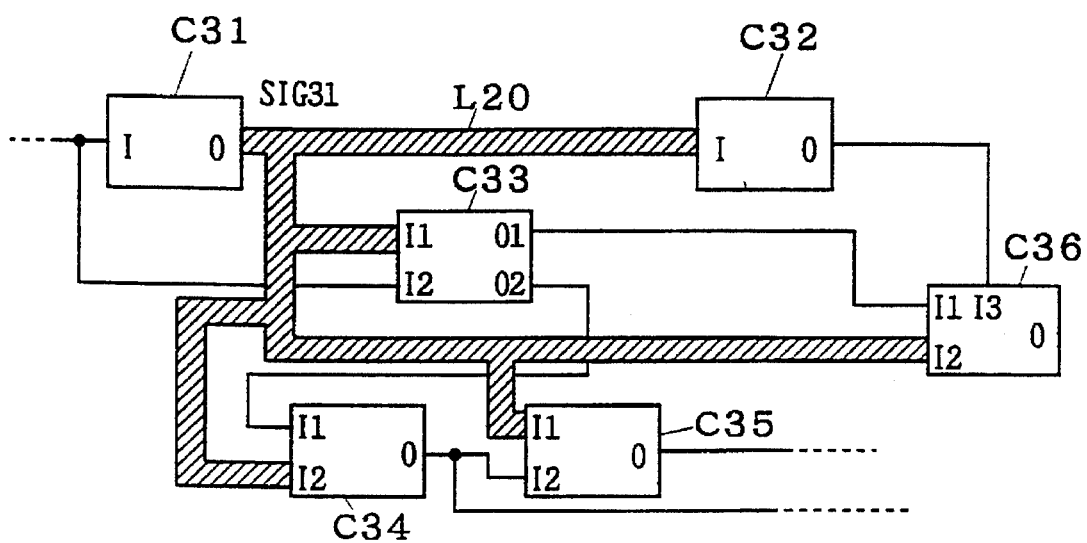
FIGS. 22 and 25 illustrate operation of the wiring delay element inserting means.

Referring to FIGS. 21 and 22, a signal name associated with the RC model is entered in the form of the RC model associated signal name and signal path name input data D16. FIGS. 21 and 22 illustrate an exemplary circuit including cells C31 to C36.

For example, when the RC model associated signal name and signal path name input data D16 indicates that the output signal of RC model designation is an output signal SIG31 from the output O of the cell C31, the selection of the RC model is made for the output line of the cell C31 which is a line L20 extending from the output O of the cell C31 to the input I of the cell C32, an input I1 of the cell C33, an input I2 of the cell C34, an input I1 of the cell C35, and an input I2 of the cell C36, as shown in FIG. 22.

Figure 23:
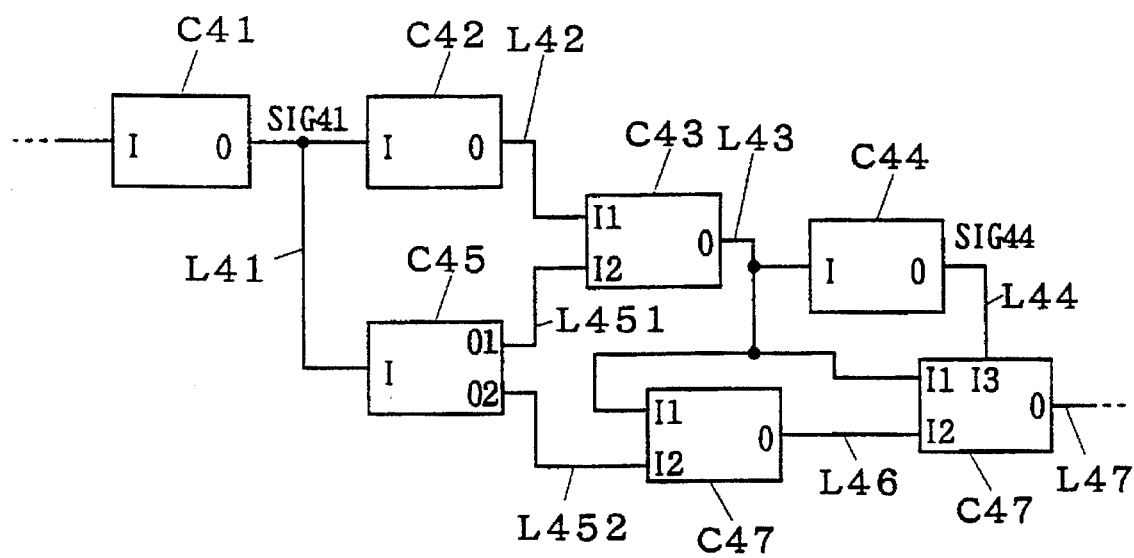
Figure 24:
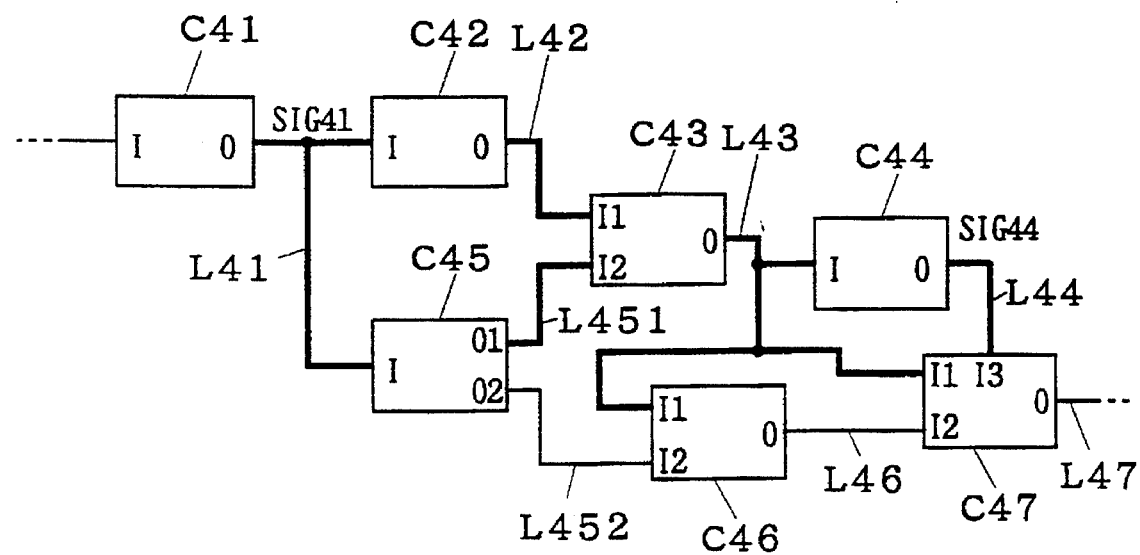
Figure 25:
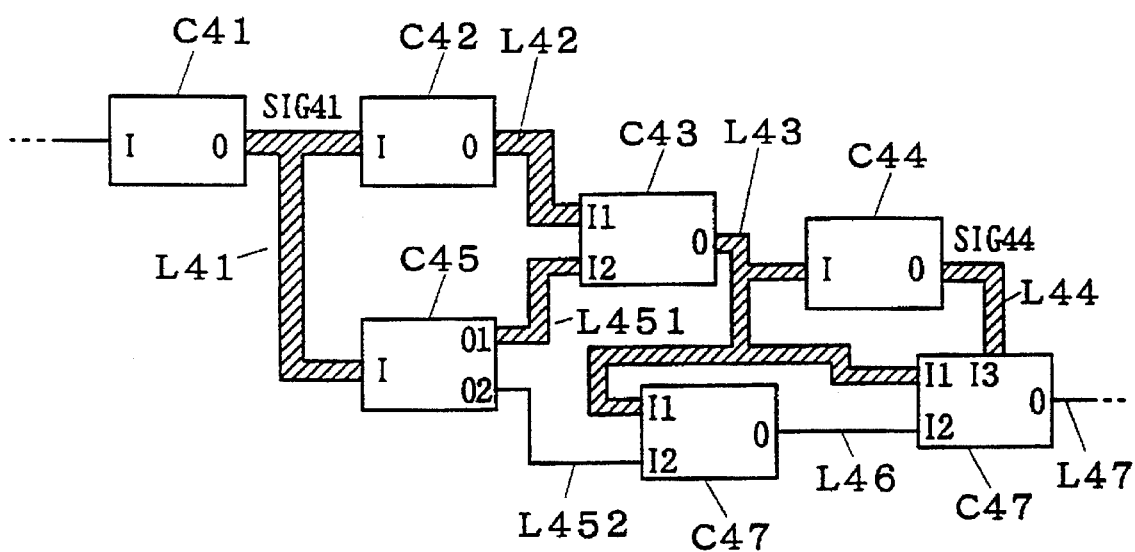
Figure 26:
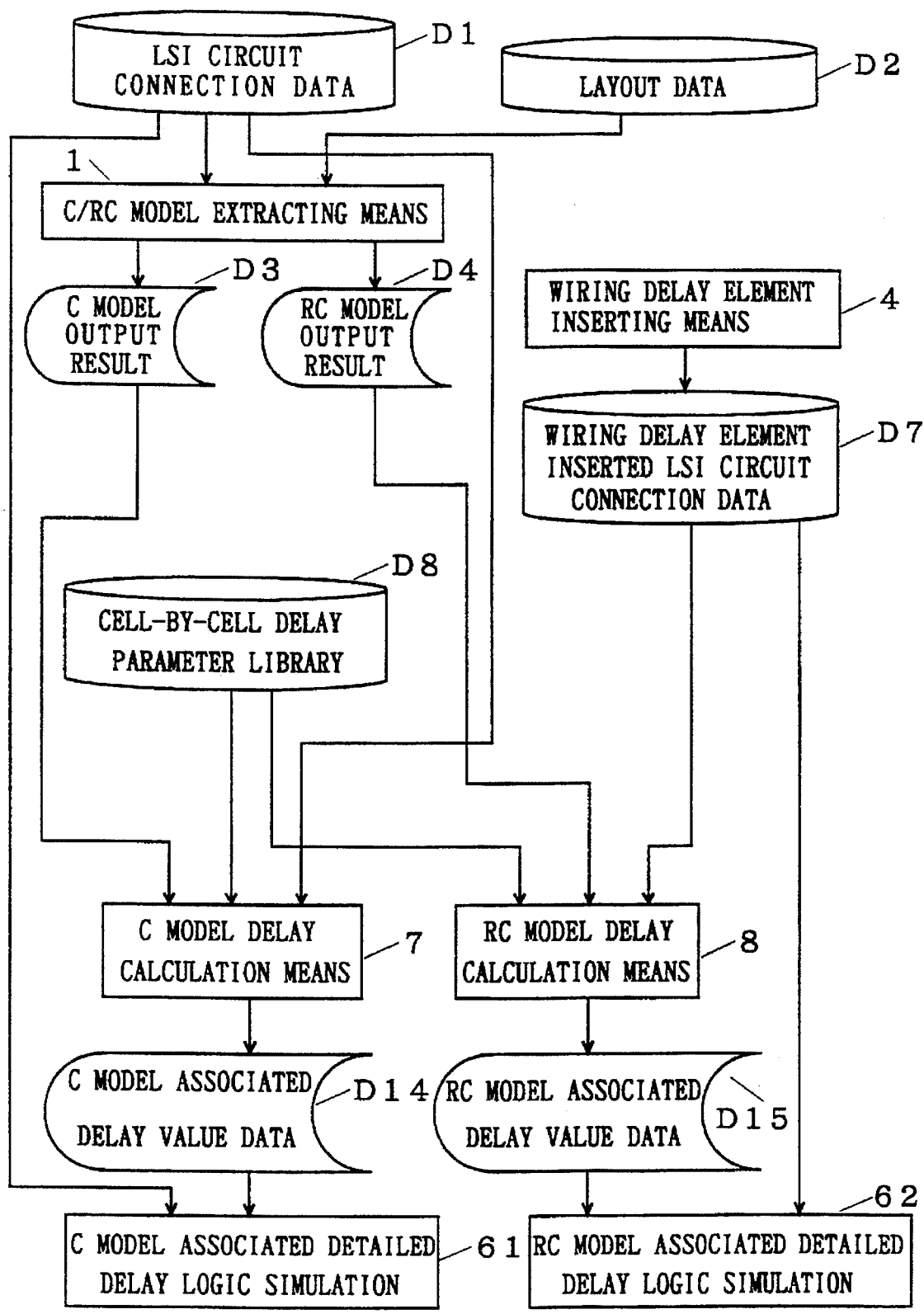
FIG. 26 is a block diagram of a conventional delay time calculating device.
Figure 27:
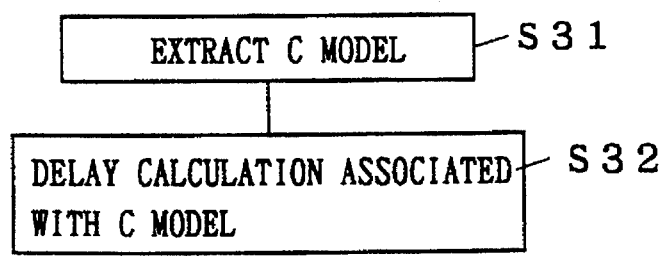
FIG. 27 is a flow chart showing a delay time calculating method associated with a C model by the conventional delay time calculating device.
Figure 28:
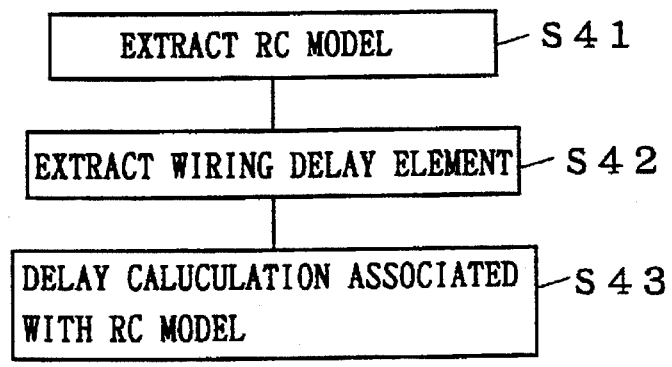
FIG. 28 is a flow chart showing a delay time calculating method associated with an RC model by the conventional delay time calculating device.

Referring to FIGS. 23 to 25, a signal path name associated with the RC model is entered in the form of the RC model associated signal name and signal path name input data D16. FIGS. 23 to 25 illustrate an exemplary circuit including cells C41 to C47.

For example, when the signal path of RC model designation is a signal path directed from a signal SIG41 from the output O of the cell C41 to a signal SIG44 from the output O of the cell C44, the cell C44 which outputs the latter signal SIG44 is the first cell to be searched, and the selection of the RC model is made for the line L44 connected to the output O of the cell C44 and the line L43 connected to the input I of the cell C44.

The cell C43 having an output O connected to the line L43 is the next cell to be searched, and the selection of the RC model is made for the lines L42 and L45 connected to the inputs I1 and I2 of the cell C43.

Then the cell C42 having an output O connected to the line L42 and the cell C45 having an output O1 connected to the line L45 are the third cells to be searched, and the selection of the RC model is made for the line L41 connected to the input I of the cell C42 and the cell C41. The line L41 carries the signal SIG41 of the cell C41, and the search is terminated.

When the above-mentioned search results in not reaching the first signal SIG41, the selection of the RC model is not made for the lines included in the search path.

Referring to FIG. 25, the wiring delay elements are inserted into the lines L41 to L44 and L451. In this manner, as the signal path is entered in the form of the RC mode associated signal name and signal path name input data D16, the model selecting means 33 automatically searches all output lines on the signal path. The RC model selection is made for a large number of output lines by relatively simple indication of the signal path.

Figure 20:
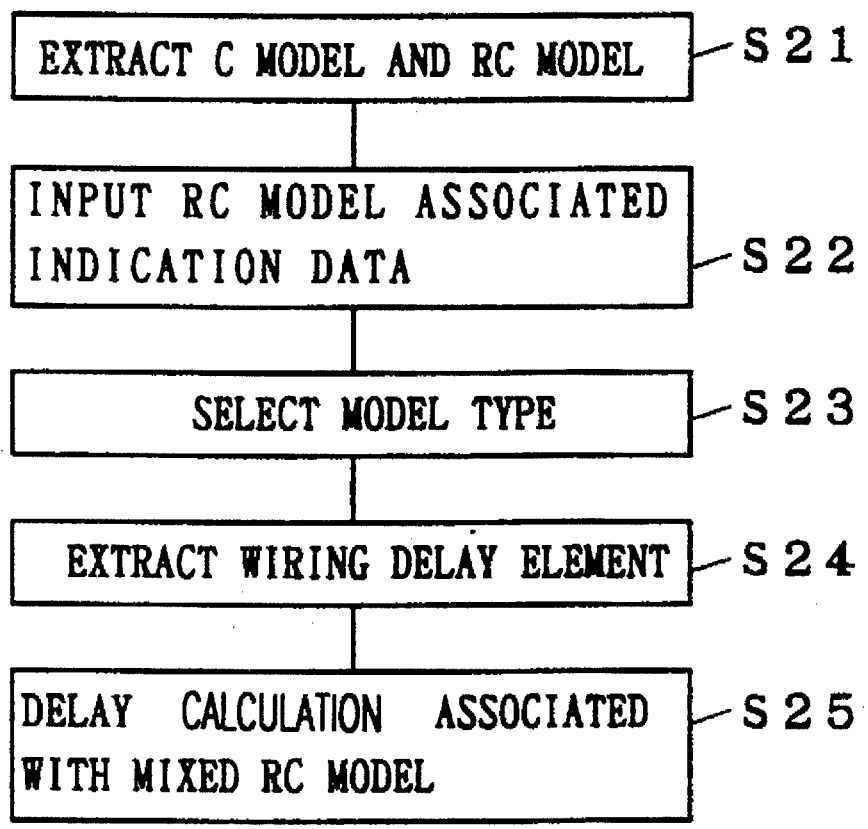
FIG. 20 is a flow chart showing the delay time calculating method by the delay time calculating device of the third preferred embodiment.

FIG. 20 is a flow chart showing the delay calculating operation of the delay time calculating device of the third preferred embodiment.

Referring to FIG. 20, in the step S21, the C/RC model extracting means 1 extracts the cell-to-cell interconnecting lines and the parasitic wiring capacitances and resistances serving as loads upon the lines from the LSI circuit connection data D1 and the layout data D2. The C/RC model extracting means 1 outputs to the mixed RC model associated delay calculating means 5 the C model output result D3 in which only the parasitic wiring capacitances among the extracted wiring capacitances and resistances correspond respectively to the plurality of output lines carrying the output signals from the plurality of cells in the LSI circuit specified by the LSI circuit connection data D1, and the RC model output result D4 in which the parasitic wiring capacitances and resistances correspond respectively to the plurality of output lines.

In the step S22, the RC model associated signal name and signal path name input data providing means not shown applies the RC model associated signal name and signal path name input data D16 to the model selecting means 33.

In the step S23, the model selecting means 33 outputs to the wiring delay element inserting means 4 the model selection result D6 in which the selected model names correspond to the respective signal output lines in the LSI circuit specified by the LSI circuit connection data D1 in accordance with the indication of the RC model associated signal name and signal path name input data D16.

In the step S24, the wiring delay element inserting means 4 recognizes the output lines for which the RC model is selected on the basis of the model selection result D6 and inserts the wiring delay elements into the output lines for which the RC model is selected in the LSI circuit specified by the LSI circuit connection data D1, to output the wiring delay element inserted LSI circuit connection data D7 to the mixed RC model associated delay calculating means 5.

In the step S25, the mixed RC model associated delay calculating means 5 receives the C model output result D3, the RC model output result D4, the wiring delay element inserted LSI circuit connection data D7 and the cell-by-cell delay parameter library D8. The mixed RC model associated delay calculating means 5 performs the delay value calculation for the RC model upon the output lines in which the wiring delay element is inserted and the cells driving the output lines by using the existing resistance and capacitance dependent delay calculating formula on the basis of the RC model output result D4 and the delay parameter group of the cell-by-cell delay parameter library D8, and performs the delay calculation upon the output lines in which the wiring delay element is not inserted and the cells driving the output lines by using the existing capacitance dependent delay calculating formula on the basis of the C model output result D3 and the delay parameter group of the cell-by-cell delay parameter library D8, to output the delay value data D9.

In this manner, the delay time calculating device of the third preferred embodiment performs the C model and RC model mixed delay value calculation upon the signals in the LSI circuit specified by the LSI circuit connection data D1 on the basis of the indication of the RC model associated signal name and signal path name input data D16.

Thus, a designer or the like produces the RC model associated signal name and signal path name input data D16 so that the calculation accuracy is not deteriorated as compared with calculation wherein the wiring delay elements are inserted into all lines while a minimum number of wiring delay elements to be inserted are required, and applies the RC model associated signal name and signal path name input data D16 to the model selecting means 33, thereby enabling high-speed calculation of an accurate delay time.

Consequently, the simulation time by the mixed RC model associated detailed delay logic simulation 6 is held at a practical level, and the logic verification time is prevented from being prolonged.

Although only the output signal or the signal path associated with the RC model is described in the RC model associated signal name and signal path name input data D16, the output signal or the signal path associated with the C model may be described together with that associated with the RC model. Otherwise, C model associated signal name and signal path name input data in which only the output signal or the signal path associated with the C model is described may be applied to the model selecting means 33.

Although the RC model associated signal name and signal path name input data D16 is data in which the output signal or the signal path associated with the RC model is described, data in which at least one of the output signal and the signal path is described ensures high-speed calculation of an accurate delay time.

While the invention has been shown and described in detail, the foregoing description is in all aspects illustrative and not restrictive. It is therefore understood that numerous modifications and variations can be devised without departing from the scope of the invention.

What is claimed is:

1. A device for calculating a delay time, comprising:

circuit connection data providing means for providing circuit connection data specifying a circuit to be verified by describing a plurality of cells each having a predetermined logic function and connection therebetween;

layout data providing means for providing layout data specifying a layout pattern of said circuit to be verified;

model data extracting means for extracting cell-to-cell interconnecting lines in said circuit to be verified and parasitic capacitances and parasitic resistances on said lines on the basis of said circuit connection data and said layout data, to output capacitance model data in which said parasitic capacitances correspond respectively to a plurality of output lines carrying output signals from said plurality of cells in said circuit to be verified, and resistance and capacitance model data in which said parasitic capacitances and said parasitic resistances correspond respectively to said plurality of output lines;

model indication data providing means for providing model indication data indicative of one of a capacitance model and a resistance and capacitance model for each of said plurality of cells and the output lines thereof in said circuit to be verified; and delay time calculating means for calculating the delay time for the cells and output lines for which said model indication data indicates the capacitance model by using said capacitance model data and a predetermined capacitance dependent delay calculating process, and calculating the delay time for the cells and output lines for which said model indication data indicates the resistance and capacitance model by using said resistance and capacitance model data and a predetermined resistance and capacitance dependent delay calculating process, on the basis of said capacitance model data, said resistance and capacitance model data, and said model indication data.

2. A device for calculating a delay time, comprising:

circuit connection data providing means for providing circuit connection data specifying a circuit to be verified by describing a plurality of cells each having a predetermined logic function and connection therebetween;

layout data providing means for providing layout data specifying a layout pattern of said circuit to be verified;

model data extracting means for extracting cell-to-cell interconnecting lines in said circuit to be verified and parasitic capacitances and parasitic resistances on said lines on the basis of said circuit connection data and said layout data, to output capacitance model data in which said parasitic capacitances correspond respectively to a plurality of output lines carrying output signals from said plurality of cells in said circuit to be verified, and resistance and capacitance model data in which said parasitic capacitances and said parasitic resistances correspond respectively to said plurality of output lines;

signal-by-signal line length data extracting means for extracting the line length of each of said plurality of output lines in said circuit to be verified on the basis of said circuit connection data and said layout data, to output line length data;

model selecting means receiving said circuit connection data and said line length data for outputting a model selection result for each of said plurality of output lines in said circuit to be verified on the basis of a comparison result between the line length of each of said plurality of output lines and a predetermined reference line length, said model selection result being indicative of a resistance and capacitance model when said line length is greater than said reference line length and being indicative of a capacitance model when said line length is not greater than said reference line length;

wiring delay element inserting means for inserting a wiring delay element into the output lines for which said model selection result indicates the resistance and capacitance model among said plurality of output lines in said circuit to be verified on the basis of said circuit connection data and said model selection result, to output wiring delay element inserted circuit connection data; and delay time calculating means for calculating the delay time for the output lines in which said wiring delay element is inserted and cells having the output lines by using said resistance and capacitance model data and a predetermined resistance and capacitance dependent delay calculating formula, and calculating the delay time for output lines in which said wiring delay element is not inserted and cells having the output lines by using said capacitance model data and a predetermined capacitance dependent delay calculating formula, on the basis of said capacitance model data, said resistance and capacitance model data, and said wiring delay element inserted circuit connection data.

3. The device of claim 2, wherein said line length extracting means includes:

subline-by-subline line length extracting means for extracting the line length of each sub-line into which each of said lines are divided at a branch point on the basis of said layout data, to output subline-by-subline line length data;

output line associated data extracting means for extracting at least one of said sub-lines corresponding to said plurality of output lines carrying said plurality of output signals in said circuit to be verified on the basis of said circuit connection data and said layout data, to provide output line associated data; and line length computing means for computing the line length of each of said plurality of output lines on the basis of said output line associate data and said subline-by-subline line length data, to output said line length data.

4. The device of claim 3, further comprising:

delay parameter data providing means for providing delay parameter data specifying for each cell type a group of delay parameters for use in said predetermined capacitance dependent delay calculating formula and said predetermined resistance and capacitance dependent delay calculating formula, wherein said delay time calculating means calculates the delay time for the output lines in which said wiring delay element is inserted and the cells having the output lines by applying said group of delay parameters to said predetermined resistance and capacitance dependent delay calculating formula using said resistance and capacitance model data, and calculates the delay time for the output lines in which said wiring delay element is not inserted and the cells having the output lines by applying said group of delay parameters to said predetermined capacitance dependent delay calculating formula using said capacitance model data, on the basis of said capacitance model data, said resistance and capacitance model data, said wiring delay element inserted circuit connection data, and said delay parameter data.

5. A device for calculating a delay time, comprising:

circuit connection data providing means for providing circuit connection data specifying a circuit to be verified by describing a plurality of cells each having a predetermined logic function and providing an output signal driven by a transistor and connection between said plurality of cells;

layout data providing means for providing layout data specifying a layout pattern of said circuit to be verified;

model data extracting means for extracting cell-to-cell interconnecting lines in said circuit to be verified and parasitic capacitances and parasitic resistances on said lines on the basis of said circuit connection data and said layout data, to output capacitance model data in which said parasitic capacitances correspond respectively to a plurality of output lines carrying the output signals from said plurality of cells in said circuit to be verified, and resistance and capacitance model data in which said parasitic capacitances and said parasitic resistances correspond respectively to said plurality of output lines;

on-resistance associated data providing means for providing on-resistance associated data associated with an on-resistance of the cell driving transistor;

model selecting means receiving said circuit connection data, said resistance and capacitance model data and said on-resistance associated data for computing an on-resistance of each of said plurality of cells in said circuit to be verified on the basis of said on-resistance associated data, to output a model selection result indicative of selection of one of a capacitance model and a resistance and capacitance model for each of said plurality of output lines in said circuit to be verified on the basis of relationship between the on-resistance of each of said plurality of cells and a wiring resistance of each of said output lines of said cells;

wiring delay element inserting means for inserting a wiring delay element into the output lines for which said model selection result indicates the resistance and capacitance model among said plurality of output lines in said circuit to be verified on the basis of said circuit connection data and said model selection result, to output wiring delay element inserted circuit connection data; and delay time calculating means for calculating the delay time for the output lines in which said wiring delay element is inserted and cell having the output lines by using said resistance and capacitance model data and a predetermined resistance and capacitance dependent delay calculating formula, and calculating the delay time for output lines in which said wiring delay element is not inserted and cells having the output lines by using said capacitance model data and a predetermined capacitance dependent delay calculating formula, on the basis of said capacitance model data, said resistance and capacitance model data, and said wiring delay element inserted circuit connection data.

6. The device of claim 5, wherein said on-resistance associated data providing means further provides delay parameter data specifying for each cell type a group of delay parameters to be applied to said predetermined capacitance dependent delay calculating formula and said predetermined resistance and capacitance dependent delay calculating formula, and said delay time calculating means calculates the delay time for the output lines in which said wiring delay element is inserted and the cells having the output lines by applying said group of delay parameters to said predetermined resistance and capacitance dependent delay calculating formula using said resistance and capacitance model data, and calculates the delay time for the output lines in which said wiring delay element is not inserted and the cells having the output lines by applying said group of delay parameters to said predetermined capacitance dependent delay calculating formula using said capacitance model data, on the basis of said capacitance model data, said resistance and capacitance model data, said wiring delay element inserted circuit connection data, and said delay parameter data.

7. A device for calculating a delay time, comprising:

circuit connection data providing means for providing circuit connection data specifying a circuit to be verified by describing a plurality of cells each having a predetermined logic function and providing an output signal driven by a transistor and connection between said plurality of cells;

layout data providing means for providing layout data specifying a layout pattern of said circuit to be verified;

model data extracting means for extracting cell-to-cell interconnecting lines in said circuit to be verified and parasitic capacitances and parasitic resistances on said lines on the basis of said circuit connection data and said layout data, to output capacitance model data in which said parasitic capacitances correspond respectively to a plurality of output lines carrying the output signals from said plurality of cells in said circuit to be verified, and resistance and capacitance model data in which said parasitic capacitances and said parasitic resistances correspond respectively to said plurality of output lines;

output signal data providing means for providing output signal data indicative of selection of one of a resistance and capacitance model and a capacitance model for each of said plurality of output signals in said circuit to be verified;

model selecting means for outputting a model selection result indicative of the resistance and capacitance model for output lines corresponding to the output signals for which selection of the resistance and capacitance model is indicated among said plurality of output lines in said circuit to be verified on the basis of said circuit connection data and said output signal data;

wiring delay element inserting means for inserting a wiring delay element into the output lines for which said model selection result indicates the resistance and capacitance model among said plurality of output lines in said circuit to be verified on the basis of said circuit connection data and said model selection result, to output wiring delay element inserted circuit connection data; and delay time calculating means for calculating the delay time for the output lines in which said wiring delay element is inserted and cells having the output lines by using said resistance and capacitance model data and a predetermined resistance and capacitance dependent delay calculating formula, and calculating the delay time for output lines in which said wiring delay element is not inserted and cells having the output lines by using said capacitance model data and a predetermined capacitance dependent delay calculating formula, on the basis of said capacitance model data, said resistance and capacitance model data, and said wiring delay element inserted circuit connection data.

8. The device of claim 7, further comprising delay parameter data providing means for providing delay parameter data specifying for each cell type a group of delay parameters for use in said predetermined capacitance dependent delay calculating formula and said predetermined resistance and capacitance dependent delay calculating formula, wherein said delay time calculating means calculates the delay time for the output lines in which said wiring delay element is inserted and the cells having the output lines by applying said group of delay parameters to said predetermined resistance and capacitance dependent delay calculating formula using said resistance and capacitance model data, and calculates the delay time for the output lines in which said wiring delay element is not inserted and the cells having the output lines by applying said group of delay parameters to said predetermined capacitance dependent delay calculating formula using said capacitance model data, on the basis of said capacitance model data, said resistance and capacitance model data, said wiring delay element inserted circuit connection data, and said delay parameter data.

9. A device for calculating a delay time, comprising:

circuit connection data providing means for providing circuit connection data specifying a circuit to be verified by describing a plurality of cells each having a predetermined logic function and providing an output signal driven by a transistor and connection between said plurality of cells;

layout data providing means for providing layout data specifying a layout pattern of said circuit to be verified;

model data extracting means for extracting cell-to-cell interconnecting lines in said circuit to be verified and parasitic capacitances and parasitic resistances on said lines on the basis of said circuit connection data and said layout data, to output capacitance model data in which said parasitic capacitances correspond respectively to a plurality of output lines carrying the output signals from said plurality of cells in said circuit to be verified, and resistance and capacitance model data in which said parasitic capacitances and said parasitic resistances correspond respectively to said plurality of output lines;

signal path data providing means for providing signal path data indicative of a signal path provided on said circuit to be verified and selecting one of a resistance and capacitance model and a capacitance model;

model selecting means for outputting a model selection result indicative of the resistance and capacitance model for all output lines lying on the signal path for which selection of said resistance and capacitance model is indicated among said plurality of output lines in said circuit to be verified on the basis of said circuit connection data and said signal path data;

wiring delay element inserting means for inserting a wiring delay element into the output lines for which the model selection result indicates the resistance and capacitance model among said plurality of output lines in said circuit to be verified on the basis of said circuit connection data and said model selection result, to output wiring delay element inserted circuit connection data; and delay time calculating means for calculating the delay time for the output lines in which said wiring delay element is inserted and cells having the output lines by using said resistance and capacitance model data and a predetermined resistance and capacitance dependent delay calculating formula, and calculating the delay time for output lines in which said wiring delay element is not inserted and cells having the output lines by using said capacitance model data and a predetermined capacitance dependent delay calculating formula, on the basis of said capacitance model data, said resistance and capacitance model data, and said wiring delay element inserted circuit connection data.

10. The device of claim 9, further comprising:

delay parameter data providing means for providing delay parameter data specifying for each cell type a group of delay parameters for used in said predetermined capacitance dependent delay calculating formula and said predetermined resistance and capacitance dependent delay calculating formula, wherein said delay time calculating means calculates the delay time for the output lines in which said wiring delay element is inserted and the cells having the output lines by applying said group of delay parameters to said predetermined resistance and capacitance dependent delay calculating formula using said resistance and capacitance model data, and calculates the delay time for the output lines in which said wiring delay element is not inserted and the cells having the output lines by applying said group of delay parameters to said predetermined capacitance dependent delay calculating formula using said capacitance model data, on the basis of said capacitance model data, said resistance and capacitance model data, said wiring delay element inserted circuit connection data, and said delay parameter data.

11. A method of calculating a delay time, comprising the steps of:

receiving circuit connection data specifying a circuit to be verified by describing a plurality of cells each having a predetermined logic function and connection therebetween, and layout data specifying a layout pattern of said circuit to be verified, and extracting cell-to-cell interconnecting lines in said circuit to be verified and parasitic capacitances and parasitic resistances on said lines on the basis of said circuit connection data and said layout data, to output capacitance model data in which said parasitic capacitances correspond respectively to a plurality of output lines carrying output signals from said plurality of cells in said circuit to be verified, and resistance and capacitance model data in which said parasitic capacitances and said parasitic resistances correspond respectively to said plurality of output lines;

extracting the line length of each of said plurality of output lines in said circuit to be verified on the basis of said circuit connection data and said layout data, to output line length data;

receiving said circuit connection data and said line length data, to output a model selection result for each of said plurality of output lines in said circuit to be verified on the basis of a comparison result between the line length of each of said plurality of output lines and a predetermined reference line length, said model selection result being indicative of a resistance and capacitance model when said line length is greater than said reference line length and being indicative of a capacitance model when said line length is not greater than said reference line length;

inserting a wiring delay element into the output lines for which said model selection result indicates the resistance and capacitance model among said plurality of output lines in said circuit to be verified on the basis of said circuit connection data and said model selection result, to output wiring delay element inserted circuit connection data; and calculating the delay time for the output lines in which said wiring delay element is inserted and cells having the output lines by using said resistance and capacitance model data and a predetermined resistance and capacitance dependent delay calculating formula, and calculating the delay time for output lines in which said wiring delay element is not inserted and cells having the output lines by using said capacitance model data and a predetermined capacitance dependent delay calculating formula, on the basis of said capacitance model data, said resistance and capacitance model data, and said wiring delay element inserted circuit connection data.

12. A method of calculating a delay time, comprising the steps of:

receiving circuit connection data specifying a circuit to be verified by describing a plurality of cells each having a predetermined logic function and providing an output signal driven by a transistor and connection between said plurality of cells, and layout data specifying a layout pattern of said circuit to be verified, and extracting cell-to-cell interconnecting lines in said circuit to be verified and parasitic capacitances and parasitic resistances on said lines on the basis of said circuit connection data and said layout data, to output capacitance model data in which said parasitic capacitances correspond respectively to a plurality of output lines carrying the output signals from said plurality of cells in said circuit to be verified, and resistance and capacitance model data in which said parasitic capacitances and said parasitic resistances correspond respectively to said plurality of output lines;

receiving on-resistance associated data associated with an on-resistance of the cell driving transistor, said circuit connection data, and said resistance and capacitance model data, and computing an on-resistance of each of said plurality of cells in said circuit to be verified on the basis of said on-resistance associated data, to output a model selection result indicative of selection of one of a capacitance model and a resistance and capacitance model for each of said plurality of output lines in said circuit to be verified on the basis of relationship between the on-resistance of each of said plurality of cells and a wiring resistance of each of said output lines of said plurality of cells;

inserting a wiring delay element into the output lines for which said model selection result indicates the resistance and capacitance model among said plurality of output lines in said circuit to be verified on the basis of said circuit connection data and said model selection result, to output wiring delay element inserted circuit connection data; and calculating the delay time for the output lines in which said wiring delay element is inserted and cells having the output lines by using said resistance and capacitance model data and a predetermined resistance and capacitance dependent delay calculating formula, and calculating the delay time for output lines in which said wiring delay element is not inserted and cells having the output lines by using said capacitance model data and a predetermined capacitance dependent delay calculating formula, on the basis of said capacitance model data, said resistance and capacitance model data, and said wiring delay element inserted circuit connection data.

13. A method of calculating a delay time, comprising the steps of:

receiving circuit connection data specifying a circuit to be verified by describing a plurality of cells each having a predetermined logic function and providing an output signal driven by a transistor and connection between said plurality of cells, and layout data specifying a layout pattern of said circuit to be verified, and extracting cell-to-cell interconnecting lines in said circuit to be verified and parasitic capacitances and parasitic resistances on said lines on the basis of said circuit connection data and said layout data, to output capacitance model data in which said parasitic capacitances correspond respectively to a plurality of output lines carrying the output signals from said plurality of cells in said circuit to be verified, and resistance and capacitance model data in which said parasitic capacitances and said parasitic resistances correspond respectively to said plurality of output lines;

providing output signal data indicative of selection of one of a resistance and capacitance model and a capacitance model for each of said plurality of output signals in said circuit to be verified;

outputting a model selection result indicative of the resistance and capacitance model for output lines corresponding to the output signals for which selection of said resistance and capacitance model is indicated among said plurality of output lines in said circuit to be verified on the basis of said circuit connection data and said output signal data;

inserting a wiring delay element into the output lines for which said model selection result indicates the resistance and capacitance model among said plurality of output lines in said circuit to be verified on the basis of said circuit connection data and said model selection result, to output wiring delay element inserted circuit connection data; and calculating the delay time for the output lines in which said wiring delay element is inserted and cells having the output lines by using said resistance and capacitance model data and a predetermined resistance and capacitance dependent delay calculating formula, and calculating the delay time for output lines in which said wiring delay element is not inserted and cells having the output lines by using said capacitance model data and a predetermined capacitance dependent delay calculating formula, on the basis of said capacitance model data, said resistance and capacitance model data, and said wiring delay element inserted circuit connection data.

14. A method of calculating a delay time, comprising the steps of:

receiving circuit connection data specifying a circuit to be verified by describing a plurality of cells each having a predetermined logic function and providing an output signal driven by a transistor and connection between said plurality of cells, and layout data specifying a layout pattern of said circuit to be verified, and extracting cell-to-cell interconnecting lines in said circuit to be verified and parasitic capacitances and parasitic resistances on said lines on the basis of said circuit connection data and said layout data, to output capacitance model data in which said parasitic capacitances correspond respectively to a plurality of output lines carrying the output signals from said plurality of cells in said circuit to be verified, and resistance and capacitance model data in which said parasitic capacitances and said parasitic resistances correspond respectively to said plurality of output lines;

providing signal path data indicative of a signal path provided on said circuit to be verified and selecting one of a resistance and capacitance model and a capacitance model;

outputting a model selection result indicative of the resistance and capacitance model for all output lines lying on the signal path for which selection of said resistance and capacitance model is indicated among said plurality of output lines in said circuit to be verified on the basis of said circuit connection data and said signal path data;

inserting a wiring delay element into the output lines for which said model selection result indicates the resistance and capacitance model among said plurality of output lines in said circuit to be verified on the basis of said circuit connection data and said model selection result, to output wiring delay element inserted circuit connection data; and calculating the delay time for the output lines in which said wiring delay element is inserted and cells having the output lines by using said resistance and capacitance model data and a predetermined resistance and capacitance dependent delay calculating formula, and calculating the delay time for output lines in which said wiring delay element is not inserted and cells having the output lines by using said capacitance model data and a predetermined capacitance dependent delay calculating formula, on the basis of said capacitance model data, said resistance and capacitance model data, and said wiring delay element inserted circuit connection data.

* * * * *